(12) United States Patent
Miyazaki et al.

(10) Patent No.: US 7,090,705 B2
(45) Date of Patent: Aug. 15, 2006

(54) ELECTRONIC DEVICE, PRODUCTION METHOD THEREOF, AND PLASMA PROCESS APPARATUS

(75) Inventors: Atsushi Miyazaki, Nara (JP); Akitsugu Hatano, Nara (JP); Osamu Sakai, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 29 days.

(21) Appl. No.: 10/684,819

(22) Filed: Oct. 15, 2003

(65) Prior Publication Data
US 2004/0137647 A1    Jul. 15, 2004

(30) Foreign Application Priority Data
Oct. 16, 2002 (JP) ............... 2002-302220
Oct. 7, 2003 (JP) ............... 2003-348303
Oct. 7, 2003 (JP) ............... 2003-348306

(51) Int. Cl.
*H01L 21/00* (2006.01)
*H01L 21/64* (2006.01)

(52) U.S. Cl. ............. 29/25.01; 118/723 E; 156/345
(58) Field of Classification Search ......... 29/25.01; 118/723, 723 E; 156/345
See application file for complete search history.

(56) References Cited

U.S. PATENT DOCUMENTS 4,979,467 A    12/1990    Kamaji et al. ............... 118/723

FOREIGN PATENT DOCUMENTS

| JP | 1-279761 | 11/1989 |
|---|---|---|
| JP | 11-144892 | 5/1999 |
| JP | 2002-217111 | 8/2002 |

OTHER PUBLICATIONS

Chinese Office Action mailed Sep. 2, 2005 (w/English translation thereof).

*Primary Examiner*—Fernando L. Toledo
(74) *Attorney, Agent, or Firm*—Nixon & Vanderhye P.C.

(57) ABSTRACT

A plasma process apparatus for performing a plasma process on a target substrate 4 includes a process chamber 5 in which the target substrate 4 is installed, a gas inlet 6 for introducing a gas into the process chamber 5, and a plasma discharge production section 15 provided in the process chamber 5. The plasma discharge production section 15 includes a first electrode 2a and a second electrode 2b that is closer to the target substrate 4 than the first electrode 2a is. Only surfaces of the first electrode 2a and the second electrode 2b which can be seen in the normal line direction of the target substrate 4 function as plasma discharge surfaces. Thus, a high quality film is realized even at a low target substrate temperature, and the film formation is performed with high gas dissociation efficiency.

23 Claims, 21 Drawing Sheets

ELECTRONIC DEVICE, PRODUCTION METHOD THEREOF, AND PLASMA PROCESS APPARATUS

BACKGROUND OF THE INVENTION

1. Field of the Invention

The present invention relates to an electronic device having functionality and to a production method of the electronic device. Specifically, the present invention relates to an electronic device including a semiconductor film, an organic film, an insulating film, etc., and to a production method of the electronic device. Further, the present invention relates to a plasma process apparatus for forming a thin film of semiconductor, conductor, or the like. Specifically, the present invention relates to plasma process apparatuses, such as a plasma chemical vapor deposition apparatus using a plasma-activated chemical vapor deposition method, which is used for forming a thin film of semiconductor, conductor, or the like, a dry etching apparatus used for forming a thin film pattern of a semiconductor film or conductor film, and an asher apparatus for removing a resist used in the formation of a thin film pattern.

2. Description of the Prior Art

A method for forming a semiconductor film, or the like, using plasma in the production of an electronic device, such as an integrated circuit, a liquid crystal display, an organic electroluminescence device, solar cell device, or the like, i.e., a so-called plasma-activated chemical vapor deposition (plasma-activated CVD) method, is advantageous because of its convenience and usability and therefore has been employed in the production of various electronic devices.

An embodiment of an apparatus using a plasma CVD method (a plasma chemical vapor deposition apparatus; hereinafter, referred to as "plasma CVD apparatus") illustrated in FIGS. 33 and 34 has been commonly employed in the art. The plasma CVD apparatus is now described with reference to FIGS. 33 and 34. FIG. 33 is a general view of a conventional plasma CVD apparatus. FIG. 34 is a schematic cross-sectional view of the conventional plasma CVD apparatus. The plasma CVD apparatus includes a closed space realized in the form of a process chamber (vacuum container) 5 and two conductive plates 2a and 2b contained in the process chamber 5 which are electrically insulated from each other and positioned in parallel so as to face each other. Plasma 11 is produced in an area between the conductive plates 2a and 2b, and a source gas is then introduced into the area so that the gas is decomposed or dissociated. As a result, a semiconductor film, or the like, is formed on a substrate 4 to be processed (target substrate 4) which is made of silicon, glass, or the like, and provided on the electrode 2b.

Commonly employed means for producing the plasma 11 that decomposes the source gas for forming a film is electric energy such as a radio frequency wave of 13.56 MHz, for example. The conductor electrode 2b has a ground potential, and the voltage is applied to the opposite electrode 2a, whereby an electric field is produced therebetween. A glow discharge phenomenon caused by a dielectric breakdown phenomenon of the electric field produces the plasma 11. The electrode 2a to which the voltage, i.e., electric energy, is applied is referred to as a cathode electrode or discharge electrode. Since a large electric field is produced in the vicinity of the cathode electrode 2a, electrons in the plasma 11 are enhanced by the electric field, and the enhanced electrons accelerate dissociation of the source gas, whereby radicals are generated. In FIG. 34, arrows 12 represent flows of radicals.

A part of discharging area (plasma) 11 in the vicinity of the cathode electrode 2a, in which a large electric field is produced, is referred to as a cathode sheath portion. The radicals generated in the cathode sheath portion or in the vicinity thereof are diffused up to the target substrate 4 provided on the ground potential electrode 2b and deposited over the surface of the substrate 4 so as to grow a film. The electrode 2b having the ground potential is referred to as an anode electrode 2b. Another electric field having a certain size is produced in the vicinity of the anode electrode 2b and is referred to as an anode sheath portion. Hereinafter, an apparatus for forming a film on the target substrate 4 placed on the anode electrode 2b by producing plasma between the two electrodes 2a and 2b that are positioned in parallel to each other is referred to as "parallel plate type apparatus".

Such a plasma CVD method has been widely employed in the production of electronic devices in various industries. For example, in a production process of an active liquid crystal display, a switching element called a TFT (Thin Film Transistor) is fabricated. In the TFT, a gate oxide film, such as an amorphous silicon film, a silicon nitride film, or the like, is an important constituent. In order to achieve desired effects of the respective films of the TFT, a technique for efficiently forming a transparent high quality insulating film is indispensable. Further, an indispensable technique for the fabrication of an organic electroluminescence device is, for example, a technique for efficiently forming, on an organic thin film, a high quality transparent insulating film as a protection film for protecting the surface of the organic thin film so as not to be exposed to the atmosphere. Further still, an indispensable technique for the fabrication of a solar cell device is, for example, a technique for efficiently forming, on a solar cell layer, a high quality film as a protection film for protecting the surface of the solar cell layer so as not to be exposed to the atmosphere. The thus-fabricated electronic devices have been widely used in various applications.

The apparatuses generically known as plasma process apparatuses includes a dry etching apparatus for etching a thin film and an asher apparatus for removing a resist, wherein an etching gas is used in place of a source gas and plasma is produced in the same way as in the plasma CVD apparatus. Production of the plasma 11 and generation of radicals are achieved by the same mechanisms as those employed in the plasma CVD apparatus. Radicals that reach the target substrate 4 remove a thin film, or the like. The dry etching apparatus and the asher apparatus are different from the plasma CVD apparatus only in that not only the radicals but also physical sputtering by ion impact from plasma and energy applied to the target substrate 4 are utilized in the etching process.

Conventionally established plasma CVD apparatuses possess various limitations. When the conventional CVD apparatus is used in the production of a large surface electronic device, such as a liquid crystal display, an amorphous solar cell device, or the like, it is sometimes difficult to achieve sufficient dissociation of the source gas and form a high quality thin film on the target substrate 4. For example, in a conventionally known parallel plate type apparatus, dissociation of the source gas is sometimes insufficient. In the case where a silicon nitride film is formed, silane ($SiH_4$), ammonium ($NH_3$), nitrogen ($N_2$), hydrogen ($H_2$), etc., are used as the source gas, and nitrogen which constitutes the film is obtained by decomposing ammonium. However, for example, in the case where the silicon nitride film is formed on a copper wiring, there is a possibility that ammonium gas corrodes the copper.

Ammonium gas has a strong chemical activity, and therefore, in some cases, a silicon nitride film should be formed using only nitrogen gas without using ammonium gas. In such a case, the parallel plate type apparatus cannot sufficiently decompose hydrogen gas and nitrogen gas, which are unlikely to be dissociated, and therefore, it is difficult to obtain a silicon nitride film having desirable insulating film characteristics and protection film characteristics. In the case where an amorphous silicon film is formed, silane, hydrogen, etc., are used as the source gas, but conventionally, the gas use efficiency is only about 10%. That is, it is understood that, also in this case, the parallel plate type apparatus cannot sufficiently accelerate dissociation of the source gas.

Conventional techniques for forming a high quality film on the target substrate 4 are disclosed in the documents described below.

For example, in a plasma apparatus disclosed in Japanese Unexamined Patent Publication No. 11-144892, a discharge electrode, which faces a glass plate, is formed by a plurality of electrodes. The electrodes are positioned such that radio frequency voltages having different polarities are applied to the electrodes so as to produce an electric discharge in a lateral direction. A reaction gas is supplied though an area between the electrodes. The gas supplied into the discharge plasma of lateral electric field undergoes a plasma reaction and then is diffused toward and deposited on the glass substrate. In this way, a high quality film is formed without causing discharge damage on the glass substrate. However, this plasma apparatus also cannot accelerate dissociation of the source gas.

A technique for accelerating dissociation of the source gas is disclosed in, for example, Japanese Unexamined Patent Publication No. 1-279761. In a plasma apparatus disclosed in this publication, a concave space is provided in a cathode electrode, and this concave space causes the hollow cathode effect so that the plasma density is increased. As a result, dissociation of the source gas is accelerated, and a faster film formation rate is achieved as compared with general parallel plate type apparatuses. However, in this apparatus, the surface of the target substrate is exposed to the plasma so that a surface of the substrate on which a film is formed is subjected to plasma damage.

Such a plasma damage can be repaired with heat energy by setting the temperature of the target substrate 4 to 300° C. or higher. However, when the temperature of the target substrate 4 is set to 200° C. or lower, a desirable film quality cannot be maintained. That is, a method for forming a high quality film by a plasma CVD apparatus with high gas dissociation efficiency especially at a low target substrate temperature has not yet been established.

Now, consider a case where the structure of the plasma apparatus disclosed in Japanese Unexamined Patent Publication No. 11-144892 is applied to a dry etching apparatus or an asher apparatus. Also in this case, a plasma production section and an ion impact control section are separately controlled. Specifically, a third electrode is attached to the back surface of the substrate 4 so as to control ion impact independently of plasma generation. Therefore, the controllability of parameters is increased.

However, also in this case, dissociation of a process gas is not accelerated, and accordingly, the process speed does not exceed a certain level. That is, a high performance plasma process apparatus which operates with high gas dissociation efficiency has not yet been established.

The thin films formed using the above techniques do not have sufficient protection film characteristics for use as devices. For example, in an organic electroluminescence device, it is necessary to provide a transparent, insulating protection film as an outermost layer of the electroluminescence device in order to prevent introduction of water vapor and oxygen from the atmosphere. Since the characteristics of an organic film in the device significantly deteriorate at the process temperature of 100° C. or higher, it is necessary to set the process temperature to a temperature lower than 100° C. during the formation of the protection film.

However, in the conventional plasma CVD apparatuses, a protection film having a desirable quality is not formed with such a temperature condition. For example, Applied Physics Letters, volume 65, pages 2229–2231 reports that, in the case where a silicon nitride film is formed as a protection film at 100° C., the quality of the silicon nitride film is poor so that water vapor contained in the atmosphere penetrates into the film, and silicon and oxygen are bonded. It is estimated from this report that water vapor and oxygen finally penetrate through the film. In a currently employed production method, another glass substrate is sealingly attached as a cap over the device in a nitrogen atmosphere for separation from the atmosphere because the quality of the protection film is poor. Devices which use a silicon nitride film as a protection film include a polysilicon solar cell device and a gallium/arsenic electronic device. These devices also suffer from the above described quality problems.

The present invention was conceived in view of the above problems. An objective of the present invention is to improve the quality of an electronic device by accelerating decomposition and dissociation of a gas with plasma such that the efficacy of the plasma process is increased.

SUMMARY OF THE INVENTION

A plasma process apparatus of the present invention is a plasma process apparatus for performing a plasma process on a target substrate, the apparatus comprising: a process chamber in which the target substrate is installed; a gas inlet for introducing a gas into the process chamber; and a plasma discharge production section provided in the process chamber, wherein the plasma discharge production section includes a first electrode and a second electrode that is closer to the target substrate than the first electrode is, and only surfaces of the first and second electrodes which can be seen in the normal line direction of the target substrate function as a plasma discharge surface.

Another plasma process apparatus of the present invention is a plasma process apparatus for performing a plasma process on a target substrate, the apparatus comprising: a process chamber in which the target substrate is installed; a gas inlet for introducing a gas into the process chamber; and a plasma discharge production section provided in the process chamber, wherein the plasma discharge production section includes a first electrode, an insulating layer formed on a portion of an electrode surface of the first electrode, and a second electrode formed on the insulating layer.

The gas inlet is preferably provided at the first electrode. The first electrode preferably has a concaved plasma discharge surface. The area of a plasma discharge surface of the first electrode is preferably larger than that of the second electrode.

The plasma discharge production section preferably includes a plurality of plasma discharge surface regions of the first electrode and a plurality of plasma discharge surface regions of the second electrode. Preferably, plasma discharge surface regions of the first electrode and plasma discharge surface regions of the second electrode are alternately provided along one planar direction of the target substrate; and the distance between the second electrode and the target substrate is greater than the distance between the adjacent second electrodes.

Preferably, the plasma process apparatus further comprises a power source for applying electric energy to the first and second electrodes, wherein the effective frequency of the power source is equal to or higher than 100 kHz and equal to or lower than 300 MHz.

A method for producing an electronic device according to the present invention is a method for producing an electronic device using a plasma process apparatus which includes a process chamber in which a target substrate is installed, and a gas inlet for introducing a gas into the process chamber, and a plasma discharge production section provided in the process chamber, the method comprising the steps of: installing the target substrate in the process chamber; introducing the gas through the gas inlet into the process chamber in which the target substrate is installed; and producing a plasma discharge by the plasma discharge production section to perform a plasma process on a surface of the target substrate, wherein the gas is introduced along a discharge route of the plasma discharge.

Another method for producing an electronic device according to the present invention is a method for producing an electronic device using the plasma process apparatus of the present invention, comprising the steps of: installing the target substrate in the process chamber; introducing the gas through the gas inlet into the process chamber in which the target substrate is installed; and producing a plasma discharge by the plasma discharge production section to perform a plasma process on a surface of the target substrate.

An electronic device of the present invention is an electronic device, comprising an insulating film on an insulating substrate, wherein: the insulating film contains silicon, nitrogen and hydrogen; and the bonded hydrogen content in the insulating film is equal to or greater than $7 \times 10^{21}$ cm$^{-3}$. Preferably, the bonded oxygen content in the insulating film is substantially 0 (zero). The insulating film is preferably formed as an outermost layer. The insulating substrate may be made of an organic material. The electronic device may further comprise an organic layer.

In the plasma process apparatus, a plasma discharge surface of the first electrode has a concavely curved surface.

Preferably, a plasma discharge surface of the first electrode and a plasma discharge surface of the second electrode constitute portions of a continuously curved surface.

A plasma discharge surface of the first electrode may have a plurality of cavities. Preferably, a gas inlet is formed in a bottom of at least one of the cavities.

A plasma discharge surface of the first electrode may be sandblasted.

Preferably, the first electrode is provided with a plurality of concavities opened onto the target substrate. The shape of the opening of each concavity is preferably rectangular. The shape of the opening of each concavity may be circular.

Still another plasma process apparatus of the present invention is a plasma process apparatus, comprising: a process chamber in which a target substrate is installed; a gas inlet for introducing a gas into the process chamber; and a plasma discharge production section provided in the process chamber for performing a plasma process on the target substrate, wherein the plasma discharge production section includes a plurality of insulators arranged in a stripe pattern extending along a direction parallel to the target substrate, first electrodes provided in at least areas between the adjacent insulators, and second electrodes provided at ends of the insulators which are closer to the target substrate such that the second electrodes are separated from the first electrodes.

The first electrodes provided between the adjacent insulators may be separated from each other.

Still another plasma process apparatus of the present invention is a plasma process apparatus, comprising: a process chamber in which a target substrate is installed; a gas inlet for introducing a gas into the process chamber; and a plasma discharge production section provided in the process chamber for performing a plasma process on the target substrate, wherein the plasma discharge production section includes a plurality of insulators arranged in a stripe pattern extending along a direction parallel to the target substrate, first electrodes provided in at least areas between the adjacent insulators, second electrodes provided at ends of the insulators which are closer to the target substrate such that the second electrodes are separated from the first electrodes, a plurality of gas inlets are formed in the first electrode, and the plurality of gas inlets are arranged along a direction that is not parallel to the longitudinal direction of the striped insulators.

Preferably, the plurality of gas inlets are arranged along a direction perpendicular to the longitudinal direction of the striped insulators.

The gas inlets may be designed to release a gas in directions parallel to each other.

Preferably, each gas inlet is designed to release a gas in a direction perpendicular to the plasma discharge surface of the first electrode.

Each gas inlet may be designed to release a gas in a direction oblique with respect to the normal line direction of the target substrate.

In a plasma process apparatus of the present invention, decomposition and dissociation of a gas with plasma is accelerated even at a low target substrate temperature while suppressing plasma damage to a surface on which a film is to be formed. Thus, the accuracy of the plasma process is improved, and the quality of a produced electronic device, or the like, is increased.

DESCRIPTION OF THE PREFERRED EMBODIMENTS

Hereinafter, embodiments of the present invention will be described with reference to the drawings. It should be noted that the present invention is not limited to the embodiments described below.

(Embodiment 1)

Figure 1:
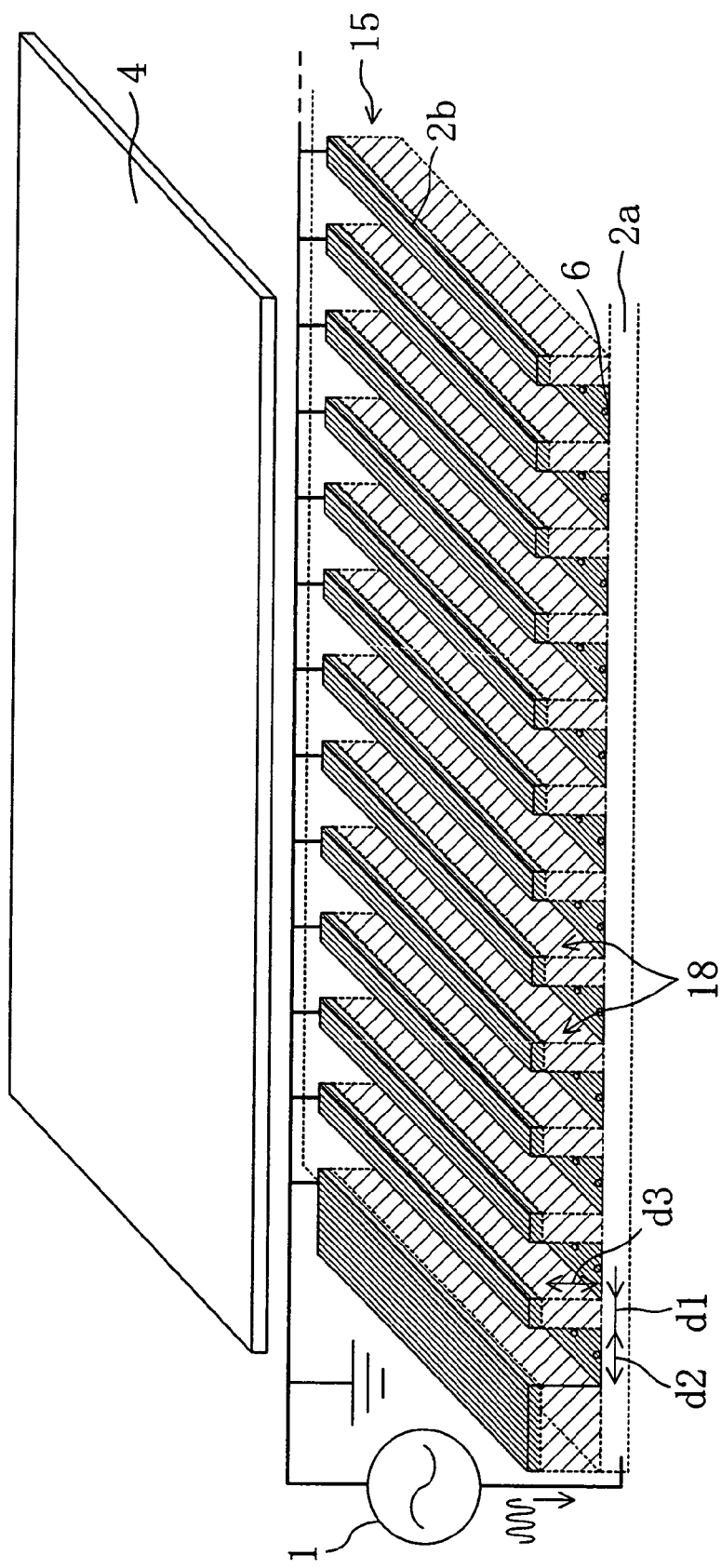
FIG. 1 is a perspective view schematically showing a plasma CVD apparatus according to embodiment 1.
Figure 2:
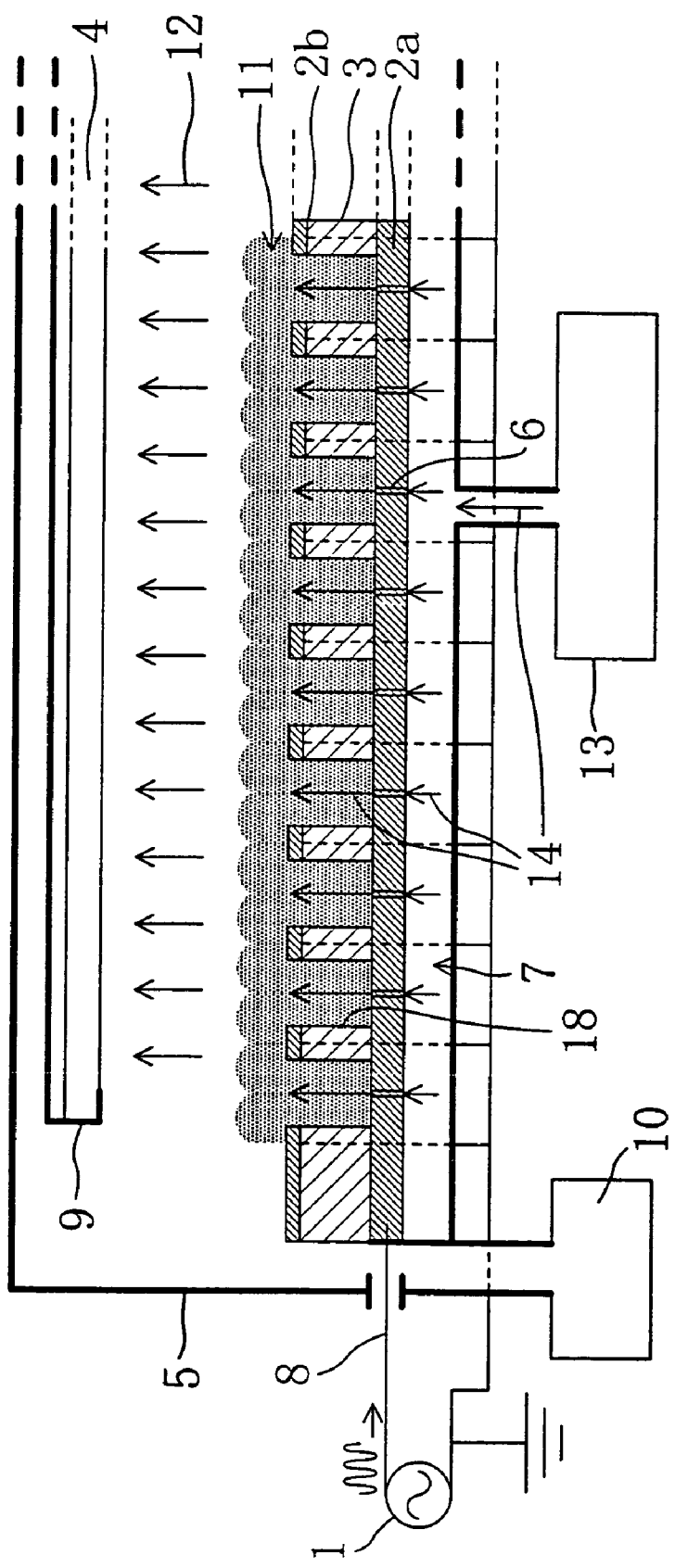
FIG. 2 is a cross-sectional view schematically showing the plasma CVD apparatus according to embodiment 1.

The structure of a plasma CVD apparatus according to embodiment 1 of the present invention is described with reference to FIGS. 1 and 2. FIG. 1 is a perspective view schematically showing the plasma CVD apparatus of embodiment 1. FIG. 2 is a cross-sectional view schematically showing the plasma CVD apparatus of embodiment 1.

The plasma CVD apparatus includes a process chamber (vacuum container) 5 in which a substrate 4 to be processed (target substrate 4) is installed, gas inlets 6 through which a source gas is introduced into the process chamber 5, and a plasma discharge production section 15 provided in the process chamber 5. Typically, a substrate holder 9 for holding the target substrate 4 is provided in the process chamber 5, and the target substrate 4 is placed on the substrate holder 9. Moreover, the substrate holder 9 can apply a bias voltage to the target substrate 4 as necessary by using a DC power supply or a low frequency power supply.

Provided outside the process chamber 5 are a radio frequency power supply 1 for supplying electric power, i.e., applying electric energy, to the plasma discharge production section 15, a gas supplying section 13 for supplying a source gas (hereinafter, also simply referred to as "gas") into the process chamber 5, and a gas outlet 10 for emitting gas from the process chamber 5. As the gas outlet 10, a mechanical booster pump or a rotary pump is used, for example. The radio frequency power supply 1 is connected to the plasma discharge production section 15 through a wiring 8.

The plasma discharge production section 15 is provided in the process chamber 5 so as to be separated from the target substrate 4 and face the target substrate 4. The plasma discharge production section 15 includes a cathode electrode (first electrode) 2a, interelectrode insulators 3 (hereinafter, also referred to as "insulating layer" or "insulators") formed on portions of an electrode surface of the cathode electrode 2a, and anode electrodes (second electrodes) 2b formed on the interelectrode insulators 3. The anode electrodes 2b are closer to the target substrate 4 than the cathode electrode 2a is.

In embodiment 1, the plurality of anode electrodes 2b are provided in a stripe pattern along one planar direction of the target substrate 4 (i.e., a direction parallel to a large surface of the target substrate 4). With such an arrangement, plasma discharge surface regions of the cathode electrode 2a and plasma discharge surface regions of the anode electrodes 2b alternately occur over the same plane. Note that details of the plasma discharge surface will be described later.

The cathode electrode 2a has the gas inlets 6 which penetrate therethrough in the thickness direction. A gas supplied from the gas supplying section 13 stays in a gas staying portion 7 and then introduced through the gas inlets 6 into the process chamber 5.

Details of the structure of the plasma discharge production section 15 are described below.

The plasma discharge production section 15 includes a plurality of insulators 3 in the form of stripes extending in a direction parallel to the target substrate 4, the cathode electrode 2a which exists at least between adjacent insulators 3, and the anode electrodes 2b each provided at an end of each insulator 3 which is closer to the target substrate 4

(i.e., at the upper end of each insulator 3) so as to be separated from the cathode electrode 2a.

The cathode electrode 2a has the shape of a plate and provided so as to be in parallel to the target substrate 4. The intervals of the neighboring insulators 3 are equal. The upper end face of each insulator 3 is covered with the anode electrodes 2b. That is, the anode electrodes 2b are also formed in a stripe pattern. Thus, the plasma discharge production section 15 includes a plurality of trenches 18 which has a concaved cross section. Each trench 18 is defined by two facing side surfaces of the neighboring insulators 3 and anode electrodes 2b and a portion of the upper surface of the cathode electrode 2a which is exposed between the insulators 3. The portion of the upper surface of the cathode electrode 2a which is exposed at the bottom of the trenches 18 constitutes the plasma discharge surface. At the bottom of each trench 18, a plurality of gas inlets 6 are formed so as to align in a trench length direction (i.e., the longitudinal direction of the trench 18) at a predetermined interval. Each gas inlet 6 is provided on the center line which halves the width of the trench 18.

For the construction of the plasma discharge production section 15, for example, as shown in FIG. 1, a large number of aluminum sticks each having a length of 300 cm and a rectangular cross section of 5 mm×3 mm are prepared. Further, an aluminum plate having a size of 110 cm×110 cm and a thickness of 3 mm is prepared. The aluminum sticks, which are to function as the anode electrodes 2b, are placed over the aluminum plate, which is to function as the cathode electrode 2a, so as to be in generally parallel to each other. The aluminum sticks are electrically insulated from the aluminum plate. Specifically, the cathode electrode 2a and the anode electrodes 2b are separated from each other, and the interelectrode insulators (insulating layers) 3 are provided in the spaces between the cathode electrode 2a and the anode electrodes 2b. The height of each interelectrode insulator 3, i.e., the distance between the cathode electrode 2a and the anode electrode 2b, is 10 mm. Hereinafter, a substrate including the cathode electrode 2a, the anode electrodes 2b and the interelectrode insulators 3 is referred to as "electrode substrate". The total size of the electrode substrate is 110 cm×110 cm. Over the surface of the electrode substrate, the plasma discharge production section 15 dominates the area of 100 cm×100 cm. The cathode electrode 2a may be formed by an integral member.

In a cross section generally perpendicular to the longitudinal direction of the anode electrodes 2b, the width d1 of the interelectrode insulators 3 and the anode electrodes 2b is 5 mm. The width d2 of the cathode electrode 2a is 10 mm. The height d3 of the interelectrode insulators 3 is 10 mm. Each interval between the anode electrodes 2b and the interelectrode insulators 3 is 15 mm. The radio frequency voltage is applied to the aluminum plate of the electrode substrate. The aluminum plate functions as the cathode electrode 2a. The aluminum sticks insulated from the aluminum plate with the interelectrode insulators 3 have the ground potential and function as the anode electrodes 2b.

A glass substrate having a thickness of 1.1 mm, which is to function as the target substrate 4, is provided at a position 20 mm upward from the anode electrodes 2b. Behind the substrate holder 9 (i.e., the side of the substrate holder 9 opposite to the surface to be processed (target surface) of the target substrate 4), a heater (not shown) for heating the target substrate 4 is provided. For example, the target substrate 4 is heated by the heater to 200° C.

The plasma discharge production section 15 produces an electric discharge (plasma) 11 according to the voltage applied between the anode electrodes 2b and the cathode electrode 2a (i.e., according to the potential difference between the anode electrodes 2b and the cathode electrode 2a). By allowing a gas to flow through the plasma discharge production section 15, the gas is decomposed/dissociated to generate radicals. In FIG. 2, arrows 12 indicate flows of radicals. The generated radicals are diffused up to the target substrate 4. The radicals adhere to and are deposited on the surface of the substrate 4 held by the substrate holder 9. Thus, a film is grown on the surface of the substrate 4, whereby a thin film is formed thereon.

The generated radicals successively reach the surface of the thin film so that the thickness of the film increases. The application of the voltage is continued until the film is grown to a predetermined thickness, and then, the application of the voltage between the cathode electrode 2a and the anode electrodes 2b (i.e., the supply of the electric power to the plasma discharge production section 15) is stopped. In this way, the plasma process is performed on the surface of the target substrate 4. Then, the target substrate 4 is removed from the substrate holder 9 and taken out of the process chamber 5, thereby obtaining a substrate on which a thin film has been formed.

Next, an operation of the plasma CVD apparatus of embodiment 1 and a method for producing an electronic device using the plasma CVD apparatus are described. Further, an operation result of an actually produced plasma CVD apparatus of embodiment 1 will be shown below. The numerical values presented in the following descriptions are only examples of the present invention but are not limitations to the present invention. Moreover, it should be noted that a bias voltage was not applied to the target substrate 4 in this operation test.

The source gas used included Si $H_4$ (200 sccm), $H_2$ (10 slm) and $N_2$ (20 slm). Note that "sccm" is a unit of the gas flow rate, which represents the amount of flowing gas per minute in cubic centimeter at 0° C. Further, note that "slm" is a unit of the gas flow rate which represents the amount of flowing gas per minute in liter at 0° C. The source gas was introduced through the aligned gas inlets 6 formed in the cathode electrode 2a. The radio frequency power supply 1 having a frequency of 13.56 MHz was used for application of electric energy.

Silicon nitride film samples were formed using the apparatus shown in FIGS. 1 and 2 with the gas pressure of 200 Pa, the radio frequency power of 7 kw, at different substrate temperatures. The quality of the formed silicon nitride film samples were checked. The result is shown in Table 1. The film formation rate of the silicon nitride film was 0.4 nm (4 Å)/sec, and the uniformity of the thickness of the thin film was ±3%.

Figure 33:
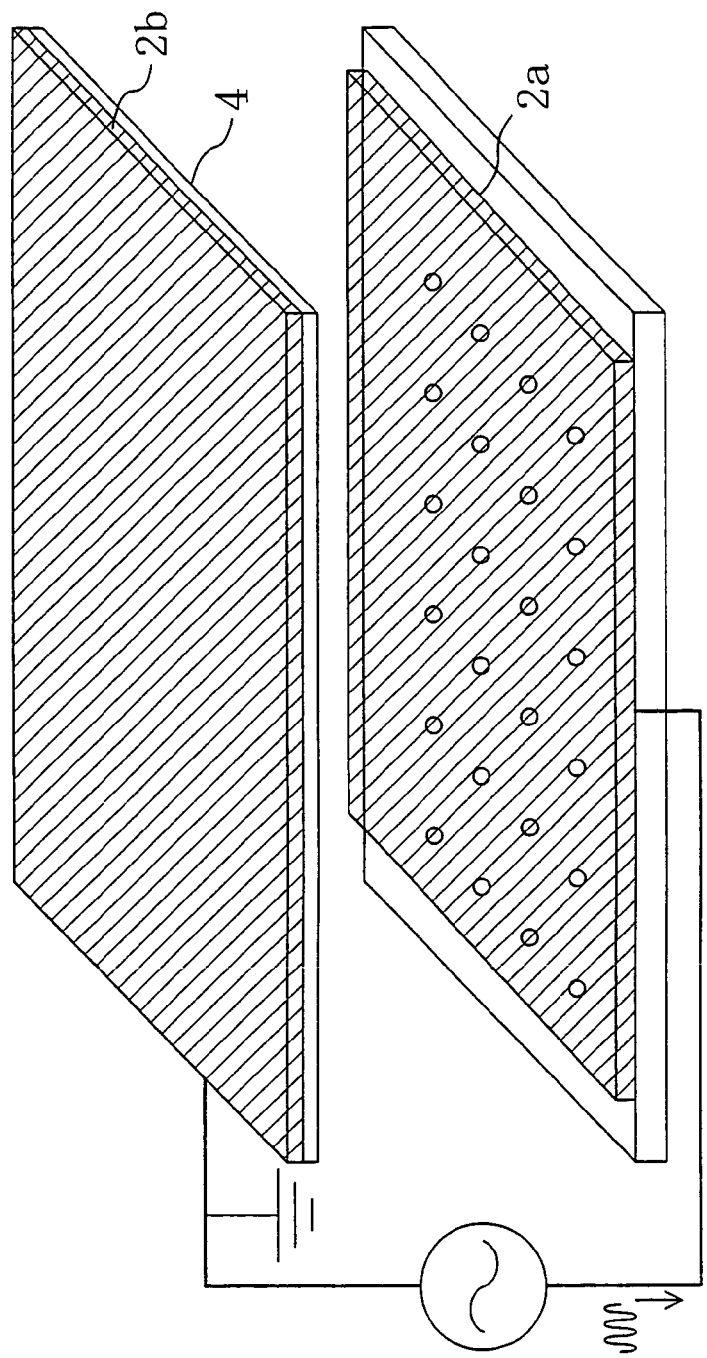
FIG. 33 is a general view of a conventional plasma CVD apparatus.
Figure 34:
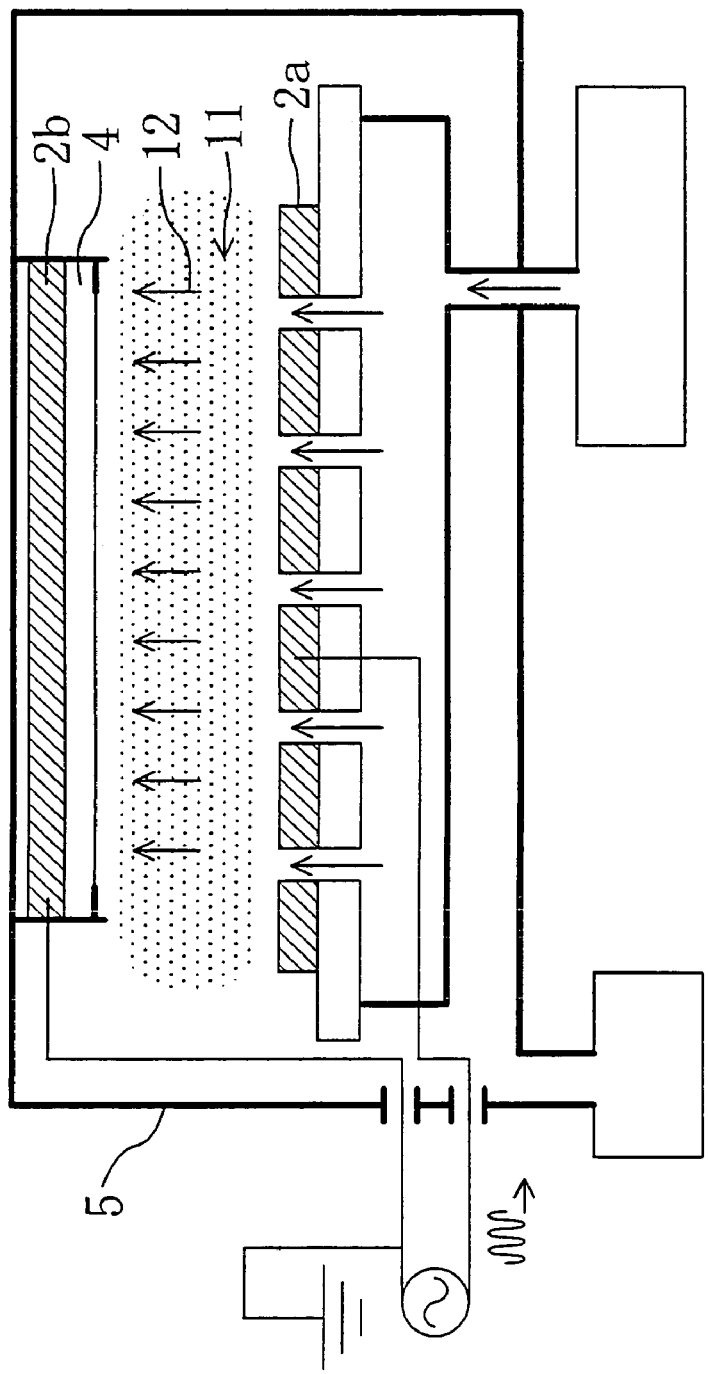
FIG. 34 is a schematic cross-sectional view of the conventional plasma CVD apparatus.

For comparison, the same operation test was performed on the apparatus shown in FIGS. 33 and 34. The apparatus shown in FIGS. 33 and 34 is the same as the apparatus of embodiment 1 except that the apparatus shown in FIGS. 33 and 34 is a parallel plate type apparatus, wherein the radio frequency power is applied to the cathode electrode 2a so that a film is formed on a glass substrate provided on the counter anode electrodes 2b. The interelectrode distance is 20 mm.

The parameters for the film quality shown in Table 1 were measured as described below. The resistivity was obtained by measuring a leaked current which flows in the film thickness direction when an electric field of 1 MA/cm was applied to the film. The unit that represent the resistivity is Ω cm. The measurement method is now described in more detail. At an end of a glass substrate for film formation, a conductive substrate for film quality measurement, e.g., a P-type silicon wafer, or the like, is placed. A film is formed over both the glass substrate for film formation and the conductive substrate. Then, on the formed film, a metal thin film of aluminum, chromium, titanium, or the like, is deposited. The voltage of about 500 V is applied between the conductive substrate and the metal thin film, and a small electric current that occurs due to the application of the voltage is measured to calculate the resistivity. An alternative method may be employed, wherein mercury is brought into contact with the surface of the formed film, and the voltage is applied through mercury.

The bonded hydrogen content is determined according to the amount of silicon-hydrogen bonds and the amount of nitrogen-hydrogen bonds by using a Fourier transform infrared spectrum method. The bonded hydrogen content is represented by the unit of $cm^{-3}$. The bonded oxygen content is determined by a relative strength that is measured by using the Fourier transform infrared spectrum method. The relative strength is a relative value of the spectrum intensity for the silicon-oxygen bonds with respect to the spectrum intensity for the silicon-nitrogen bonds. A method for measuring the bonded hydrogen content and bonded oxygen content is now described in more detail. As in the resistivity measurement, a conductive substrate for film quality measurement, e.g., a P-type silicon wafer, or the like, is placed at an end of a glass substrate for film formation. A film is formed over both the glass substrate for film formation and the conductive substrate. The formed film is irradiated with infrared laser light, and an obtained interference waveform is Fourier converted, whereby absorption of infrared light by the film is measured as a wave number spectrum. The bonded hydrogen content and bonded oxygen content can be obtained from the peaks resulting from hydrogen bond (in the vicinity of 2150 $cm^{-1}$ and 3350 $cm^{-1}$) and the peak resulting from oxygen bond (in the vicinity of 1070 $cm^{-1}$). Measurements of the amount of nitrogen-hydrogen bonds, the spectrum intensity of silicon-nitrogen bonds, and the spectrum intensity of silicon-oxygen bonds are possible according to, for example, "Assessment of amorphous thin film" by Ken Imura, pages 53–55 (1989; Kyoritsu Shuppan Co., Ltd.).

Other possible methods for measuring the bonded hydrogen content include a method wherein a gas chromatography method is used when a sample is heated (up to several hundreds of Celsius degrees) and a secondary ion-mass spectrography method. According to the secondary ion-mass spectrography method, the measurement resolution is several hundred micrometers, and thus, the analysis can be performed in the film depth direction. Therefore, the analysis can be performed even when a film to be measured is a constituent of a device.

As shown in Table 1, the films formed by the apparatus of embodiment 1 have superior resistivity, i.e., high resistivity, for all the temperatures as compared with the films formed by a conventional parallel plate type apparatus. In the apparatus of the present invention, film formation is achieved with substantially no plasma damage, so that the high quality film is obtained. However, in the parallel plate type apparatus, the plasma damage on the film formation surface is not avoided, so that a desirable film quality cannot be obtained.

In embodiment 1, the bonded hydrogen content is substantially constant for all the temperatures, whereas in the parallel plate type apparatus, the bonded hydrogen content is significantly small when the temperature of the target substrate 4 is 100° C. This is because, in the case of the parallel plate type apparatus, the amount of dissociated hydrogen molecules is small. Specifically, when the temperature of the target substrate 4 is high, hydrogen atoms are sufficiently diffused over the film surface so that hydrogen termination of the dangling bonds is sufficiently achieved. However, when the temperature of the target substrate 4 is low, the distance that hydrogen atoms are diffused toward the film surface is decreased. Therefore, hydrogen termination of the dangling bonds is not sufficiently achieved because the number of hydrogen atoms present in the gas is small, and accordingly, dangling bonds are left in the film. If dangling bonds are present in the film, the film quality deteriorates, and in addition, it is difficult to maintain the stability of the film for a long time period.

In the plasma CVD apparatus of embodiment 1, the amount of dissociated hydrogen molecules is large. Thus, termination of the dangling bonds is sufficiently achieved with amply supplied hydrogen even when the temperature of the target substrate 4 is low and the distance that hydrogen atoms are diffused toward the film surface is short. Therefore, in an electronic device obtained by the plasma CVD apparatus of embodiment 1, the bonded hydrogen content in the insulating film is large as compared with a conventional device. For example, as shown in Table 1, an electronic device whose bonded hydrogen content in the insulating film is $7 \times 10^{21}$ $cm^{-3}$ or greater, and is preferably $1 \times 10^{22}$ $cm^{-3}$ or greater, is obtained.

TABLE 1

| | Embodiment 1 | | | Parallel plate type apparatus | | |
|---|---|---|---|---|---|---|
| Target substrate temp. | 300° C. | 200° C. | 100° C. | 300° C. | 200° C. | 100° C. |
| Resistivity (Ω cm) | $1.2 \times 10^{13}$ | $6.2 \times 10^{13}$ | $1.0 \times 10^{14}$ | $3.3 \times 10^{12}$ | $1.7 \times 10^{13}$ | $3.6 \times 10^{11}$ |
| Bonded hydrogen content ($cm^{-3}$) | $1.0 \times 10^{22}$ | $7.0 \times 10^{21}$ | $1.0 \times 10^{22}$ | $4.6 \times 10^{21}$ | $5.5 \times 10^{21}$ | $2.1 \times 10^{20}$ |
| Bonded oxygen content (initial) | 0 | 0 | 0 | 0 | 0 | 0 |
| Bonded oxygen content (1 month later) | 0 | 0 | 0 | 0.1 | 0.1 | 0.4 |

In both the apparatus of embodiment 1 and the conventional parallel plate type apparatus, an oxygen bond was not observed in the earlier steps of the film formation, and the bonded oxygen content was 0 (zero). However, in the measurement of the films exposed to the atmosphere for one month, oxygen bonds were observed in a film formed by the parallel plate type apparatus. The bonded oxygen content increased as the film quality was deteriorated. On the other hand, in a film formed by the apparatus of embodiment 1, oxygen bonds were not observed in the measurement performed one month after the formation of the film. Thus, a transparent insulating film having superior protective properties can be formed by the plasma CVD apparatus of embodiment 1. An electronic device including an insulating film as an outermost layer maintains stability for a long term.

The state of the inside of the reaction chamber after the formation of the film was observed. When the temperature of the target substrate 4 of the parallel plate type apparatus was 100° C., many powders of a reaction product were observed. These powders are considered to be silane polymer powders. It is known that the generated powders are taken in the film during the film formation so that the film quality is deteriorated. In embodiment 1, no powder was observed for all the temperatures. Also in view of this, it is understood that the apparatus of embodiment 1 exhibits superior apparatus performance.

In the plasma CVD apparatus of embodiment 1, only portions of each electrode surface of the cathode electrode 2a and the anode electrodes 2b which can be viewed in the normal line direction of the target substrate 4 function as plasma discharge surfaces. In other words, all the plasma discharge surfaces of the cathode electrode 2a and the anode electrodes 2b can be seen downward from the position of the target substrate 4. It should be noted herein that the plasma discharge surface does not mean a surface of a member used as the cathode electrode 2a or the anode electrode 2b but mean a surface which exchanges charged particles (electric charge) with plasma, i.e., a surface which actually functions as a discharge electrode.

Specifically, the surface of each anode electrode 2b which is closer to the cathode electrode 2a (i.e., the lower surface of each anode electrode 2b) and portions of the upper surface of the cathode electrode 2a which overlap the regions where the anode electrodes 2b are formed cannot be viewed in the normal line direction of the target substrate 4. Since the interelectrode insulators 3 are present between the surfaces of the anode electrodes 2b which are closer to the cathode electrode 2a and the portions of the upper surface of the cathode electrode 2a which overlap the regions where the anode electrodes 2b are formed, none of the surfaces of the anode electrodes 2b which are closer to the cathode electrode 2a and the portions of the upper surface of the cathode electrode 2a which overlap the regions where the anode electrodes 2b are formed functions as a plasma discharge surface.

Now, consider a case where the interelectrode insulators 3 are not present between the electrodes 2a and 2b, for example. In this case, the surfaces of the anode electrodes 2b which are closer to the cathode electrode 2a and the portions of the upper surface of the cathode electrode 2a which overlap the regions where the anode electrodes 2b are formed also function as plasma discharge surfaces. If the radio frequency power is applied to the cathode electrode 2a, a large part of the electric discharge occurs in the space between the surface of the cathode electrode 2a and the surfaces of the anode electrodes 2b which are closer to the cathode electrode 2a. However, even if the source gas is dissociated by the plasma produced in the space, a large part of dissociated radicals attach onto the surfaces of the anode electrodes 2b which are closer to the cathode electrode 2a, so as to form a film thereon. Thus, since the intended film formation speed is not achieved, the throughput of the apparatus is limited. In the plasma CVD apparatus of embodiment 1 shown in FIGS. 1 and 2, all of the surfaces of the electrodes which function as the plasma discharge surface can be viewed the position of the target substrate 4. In other words, the plasma discharge surface of the cathode electrode 2a and the plasma discharge surfaces of the anode electrodes 2b do not face each other. Therefore, a large part of the dissociated radicals are efficiently guided to the target substrate 4.

Another advantage of the above structure, wherein all the electrode surfaces which function as plasma discharge surfaces can be seen from the position of the target substrate 4 as shown in FIGS. 1 and 2, resides in that the available pressure range increases in the case of the parallel plate type apparatus shown in FIGS. 33 and 34, the distance between electrodes is determined by the structure of the apparatus, and therefore, the distance between electrodes is equal to the length of the discharge route. As a result, the source gas pressure which readily produces plasma is limited within a certain pressure range. This is because the mechanism is dominated by the Paschen's law, which is famous in the field of discharge engineering. The Paschen's law is that a value of the spatial field intensity at which an electric discharge can be started is determined by the product of the source gas pressure and the length of the discharge route. The spatial field intensity at which an electric discharge can be started takes a minimum value when the product takes a certain value, and increases as the product increases/decreases away from the certain value.

Figure 3:
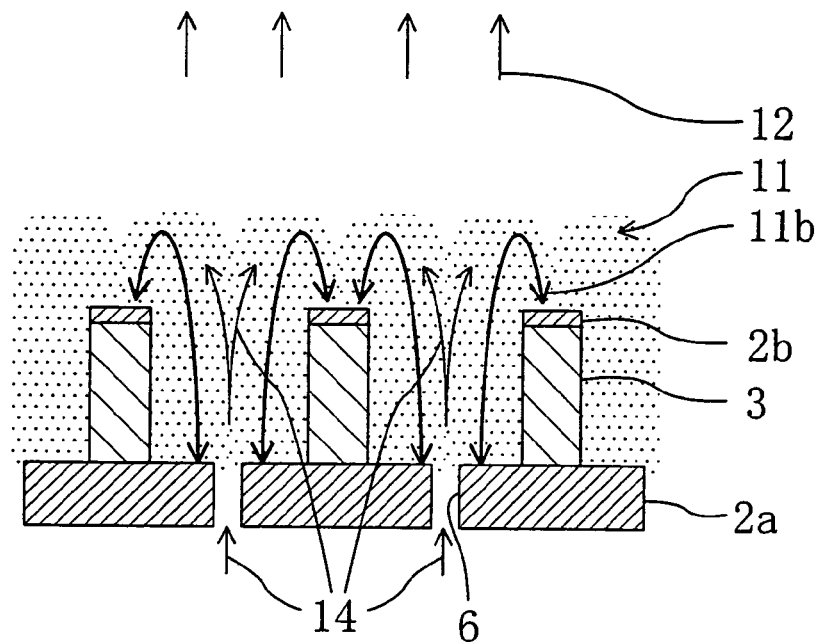
FIG. 3 illustrates discharge routes that are taken when the source gas pressure is relatively high.
Figure 4:
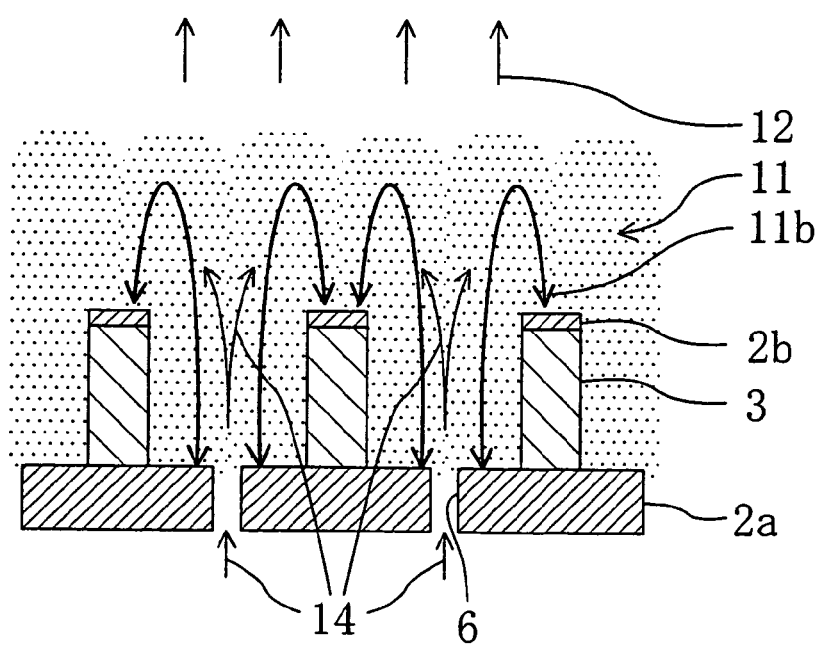
FIG. 4 illustrates discharge routes that are taken when the source gas pressure is relatively low.

On the other hand, in the case of the structure shown in FIGS. 1 and 2, since the electrode surfaces of the electrodes 2a and 2b do not face each other, the length of the route of an electric discharge that occurs between the electrodes 2a and 2b changes according to a variation in the source gas pressure as shown in FIGS. 3 and 4. In FIGS. 3 and 4, arrows 11b indicate typical routes of the electric discharge. FIG. 3 shows an example of a relatively high source gas pressure, wherein the discharge routes are short. FIG. 4 shows an example of a relatively low source gas pressure, wherein the discharge routes are long.

Furthermore, it is advantageous that the electrodes 2a and 2b are not present in the same plane. Specifically, according to embodiment 1, the discharge route is longer generally by the height of the interelectrode insulator 3 as compared with the case where the electrodes 2a and 2b are present on generally the same plane (see, for example, Japanese Unexamined Patent Publications Nos. 2001-338885, 2002-217111, and 2002-270522), and therefore, the gas dissociation efficiency increases. Moreover, the length of the discharge route is adjusted by adjusting the height of the interelectrode insulator 3, the degree of freedom for adjustment of the source gas pressure increases. Thus, the source gas pressure range in which plasma is readily generated is extended by appropriately changing the length of the discharge route.

Regarding the positions of the gas inlets 6, it is better to provide the gas inlets 6 at positions near the cathode electrode 2a rather than the anode electrodes 2b as shown in FIGS. 1 and 2. In the apparatus of embodiment 1, the cathode electrode 2a is more distant from the target substrate 4 than the anode electrodes 2b is. Thus, the gas is introduced from the side of the cathode electrode 2a so that smooth gas streams 14 toward the substrate 4 are realized. Further, the plasma region is present between the cathode electrode 2a and the anode electrodes 2b, and the source gas flows along the discharge routes of the plasma discharge. As a result, the distance of the source gas stream in the plasma increases, whereby dissociation of the source gas is accelerated.

The area of the plasma discharge surface of the cathode electrode 2a is desirably larger than that of the plasma discharge surfaces of the anode electrodes 2b because of the reasons described below. In the parallel plate type apparatus, the electric field produced in the anode sheath portion is smaller than that produced in the cathode sheath portion. This is because even if the actual areas of the electrodes 2a and 2b are generally the same, walls in the vicinity of the anode electrodes 2b also have the same ground potential, and therefore, the total area of the ground potential portions is larger than the area of the cathode electrode 2a. Thus, by designing the plasma discharge production section 15 such that the area of the plasma discharge surface of the cathode electrode 2a is larger than that of the plasma discharge surface of the anode electrodes 2b, the electric field produced in the anode sheath portion becomes greater than that produced in the cathode sheath portion. Under such a condition, dissociation of the gas is accelerated not only in the cathode sheath portion but also in the anode sheath portion, and accordingly, the entire quantity of the dissociated gas further increases.

In embodiment 1, the repetition distance between the adjacent anode electrodes 2b, i.e., the pitch of the anode electrodes 2b, is 15 mm while the distance between the anode electrodes 2b and the surface of the target substrate 4 is 20 mm. In this case, the film thickness distribution is ±3% or smaller. However, if the distance between the anode electrodes 2b and the surface of the target substrate 4 is 14 mm, in other words, if the distance between the anode electrodes 2b and the surface of the target substrate 4 is shorter than the pitch of the anode electrodes 2b, the film thickness distribution is ±8% so that the film thickness distribution results in a waveform depending on the pattern of the electrodes 2a and 2b. As shown in FIGS. 1 and 2, the anode electrodes 2b has a stripe pattern, but this pattern should not be transcribed in the formed film. In order to avoid such transcription, the distance between the anode electrodes 2b and the surface of the target substrate 4 is desirably greater than the repetition distance of the anode electrodes 2b.

Figure 5C:
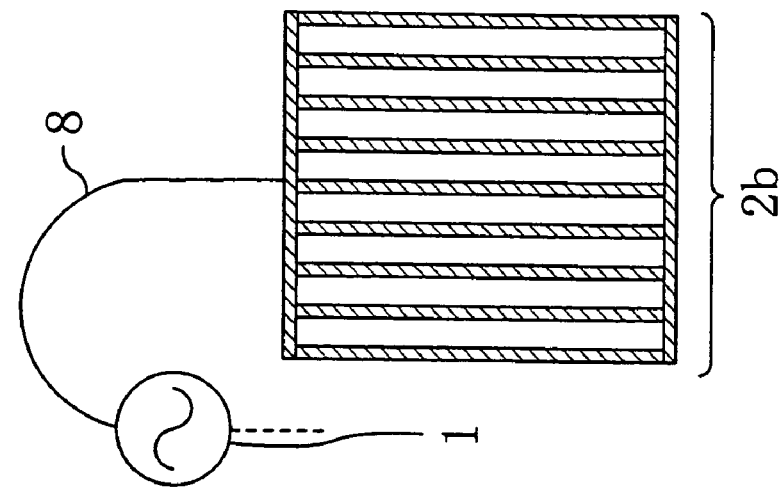
FIG. 5A, FIG. 5B, and FIG. 5C are plan views schematically showing respective alternative embodiments of a connection of a radio frequency power supply and an anode electrode.
Figure 5B:
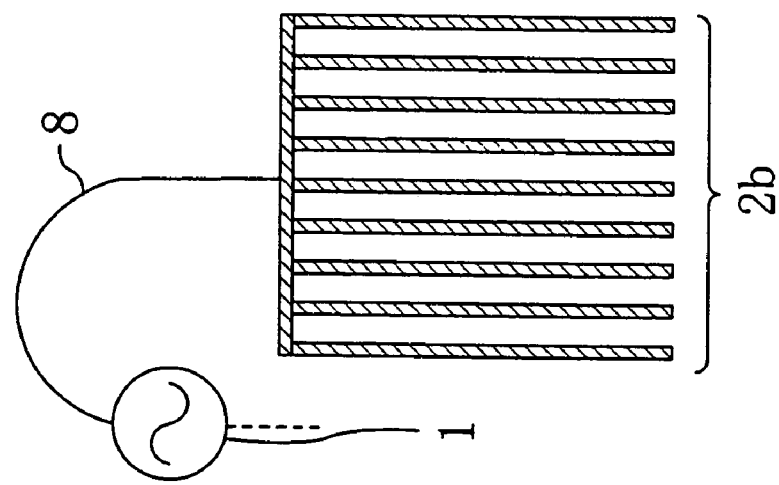
Figure 5A:
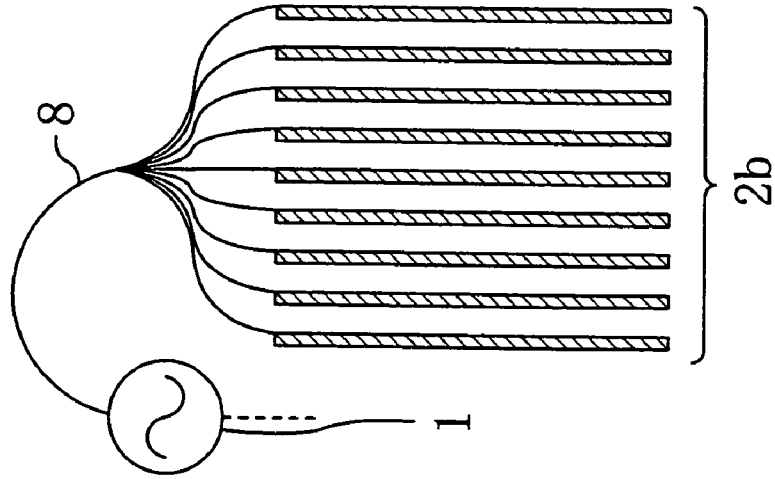

In the apparatus of embodiment 1, each of a plurality of stick-like anode electrodes 2b is connected to the radio frequency power supply 1 through the wiring 8 at one end as shown in FIG. 5A, but the present invention is not limited thereto. For example, in an alternative example shown in FIG. 5B, ends of a plurality of stick-like anode electrodes 2b on the same side are connected by another stick of the same material, and the connection stick is connected to the radio frequency power supply 1 through the wiring 8. In another alternative example shown in FIG. 5C, both ends of a plurality of stick-like anode electrodes 2b are connected by other sticks of the same material, and one of the connection sticks is connected to the radio frequency power supply 1 through the wiring 8.

Referring to FIG. 2, the target substrate holder 9 holds the target substrate 4 only at an end or the target substrate 4, and therefore, the target substrate 4 is at a floating potential. On the other hand, for the purpose of achieving a uniform substrate temperature over the large surface of the target substrate 4, a conductor plate may be provided behind the target substrate 4 so as to be in physical contact with the target substrate 4. In this case, the conductor plate may be at a floating potential or may be the ground potential. That is, it is not necessary to consider the potential of the target substrate 4 because the plasma 11 exists away from the target substrate 4, and therefore, only neutrally charged radicals fly toward the target substrate 4. In the case where a film formation process requires a certain level of ion impact against the surface of the substrate, it is possible to provide a conductor plate behind the target substrate 4 to aggressively control the potential of the target substrate 4. In such a case, an ion flux is lead out of the plasma 11, which is at a distant position, by controlling the potential of the conductor plate provided behind the target substrate 4, such that the surface of the target substrate 4 is irradiated with ion.

In embodiment 1, the glass plate is used as the target substrate 4, the material of the target substrate 4 is not limited to the glass plate. As previously described, a high quality film can be formed even when the substrate temperature is 100° C., and thus, a substrate made of an organic material may be used as the target substrate 4. For example, a substrate made of a resin material, such as a plastic substrate having a glass transition temperature of about 200° C., may be used. The apparatus of the present invention may be used to form a silicon nitride film or an amorphous silicon film on a resin substrate, or the like, to produce a TFT device.

In embodiment 1, the frequency of the radio frequency power supply 1 is set to 13.56 MHz, but it is not limited to such a particular value. In the apparatus of embodiment 1, the plasma 11 scarcely exists over the surface of the substrate 4, and thus, an increase of plasma damage, which may occur at a low frequency equal to or lower than 13.56 MHz, is avoided. Thus, a low frequency equal to or lower than 13.56 MHz may be available for film formation without suffering from such an adverse effect. It should be noted, however, that the appropriate lower limit of the frequency is 300 KHz. This is because 300 KHz is the limit on the ion density increasing effect achieved by ions trapped between the electrodes 2a and 2b.

Furthermore, a high frequency band of 13.56 MHz or higher, which is generally called VHF (Very High Frequency) band, is available. In the parallel plate type apparatus, as the frequency increases and the free space wavelength decreases, a standing wave occurs especially when the parallel plate type apparatus is large. This problem is now described in more detail. The radio frequency wave exists in the plasma (specifically, the outermost portion of the plasma) with a certain distribution. Thus, when the plasma has a size such that a standing wave can occur, for example, when the plasma has a size of about 1.5 m for a ½ wavelength and a frequency of 100 MHz, a standing wave occurs and the radio frequency intensity becomes uneven. As a result, the thickness of a formed film is thicker in a region where the radio frequency intensity is strong, while the thickness of the film is thinner in a region where the radio frequency intensity is weak.

According to the present invention, the plasma portion consists of small plasma clouds independent from each other, and thus, a standing wave does not occur in principle. This feature of the present invention is now described in more detail. In the apparatus of the present invention, a large number of small plasma clouds are produced according to the electrode pattern such that each plasma cloud has a size of several centimeters or smaller along the normal line direction of the cathode electrode 2a. In FIGS. 2, 3 and 4, adjacent plasma clouds are illustrated so as to be in contact with each other, but in the actual apparatus, adjacent plasma clouds are separated at the regions above the anode electrodes 2b. Accordingly, propagation of the radio frequency wave is interrupted by gaps between the adjacent plasma clouds, and as a result, no standing wave occurs. Thus, according to the present invention, a radio frequency wave within the VHF band is available for a large-size plasma CVD apparatus. It should be noted, however, that the appropriate upper limit of the frequency is 300 KHz. This is because, at 300 KHz, the electron density increasing effect achieved by electrons trapped between the electrodes $2a$ and $2b$ is saturated. The electron trapping effect does not change even if the frequency is increased higher than 300 KHz, and moreover, it is difficult to supply such a higher frequency power.

(Embodiment 2)

Figure 6:
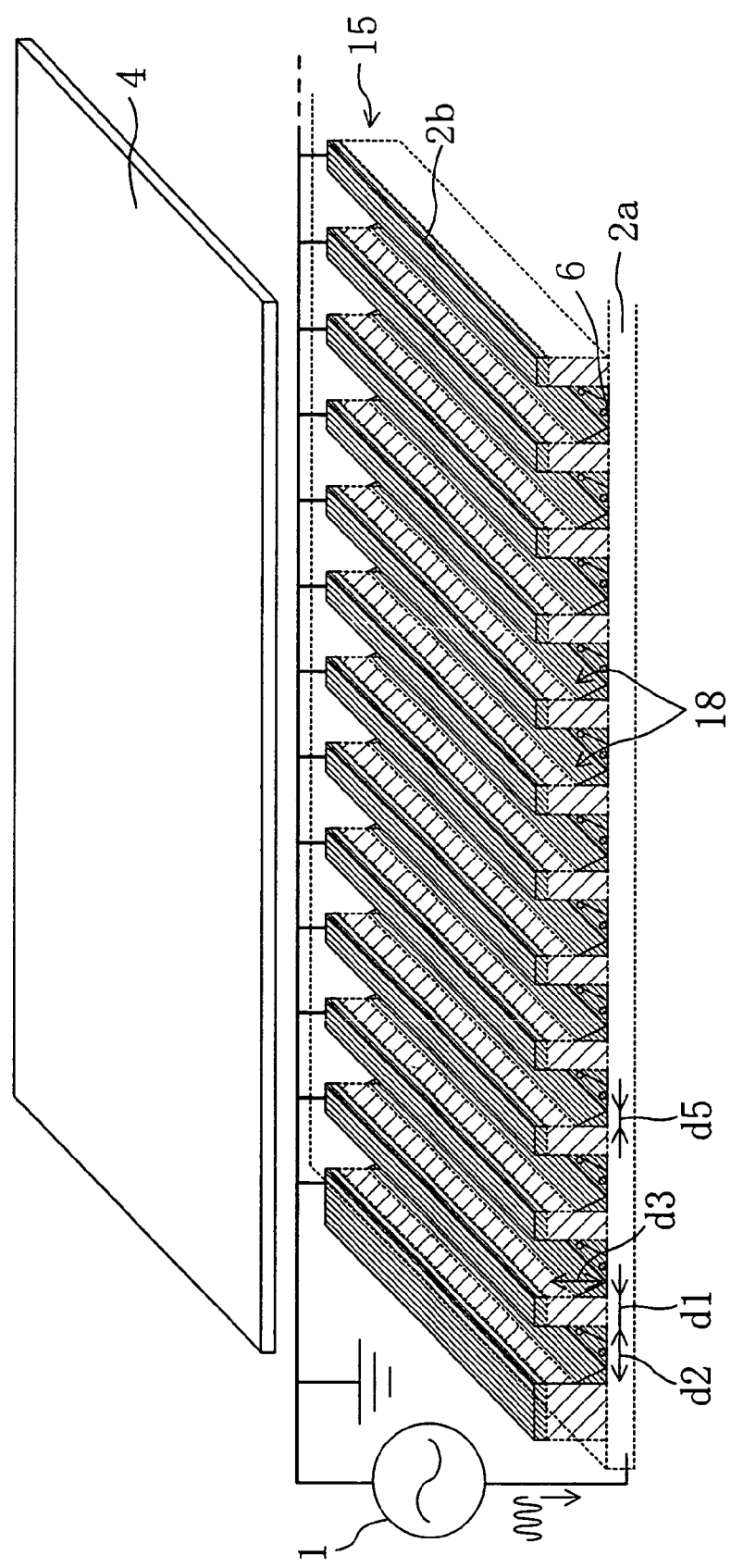
FIG. 6 is a perspective view schematically showing a plasma CVD apparatus according to embodiment 2.
Figure 7:
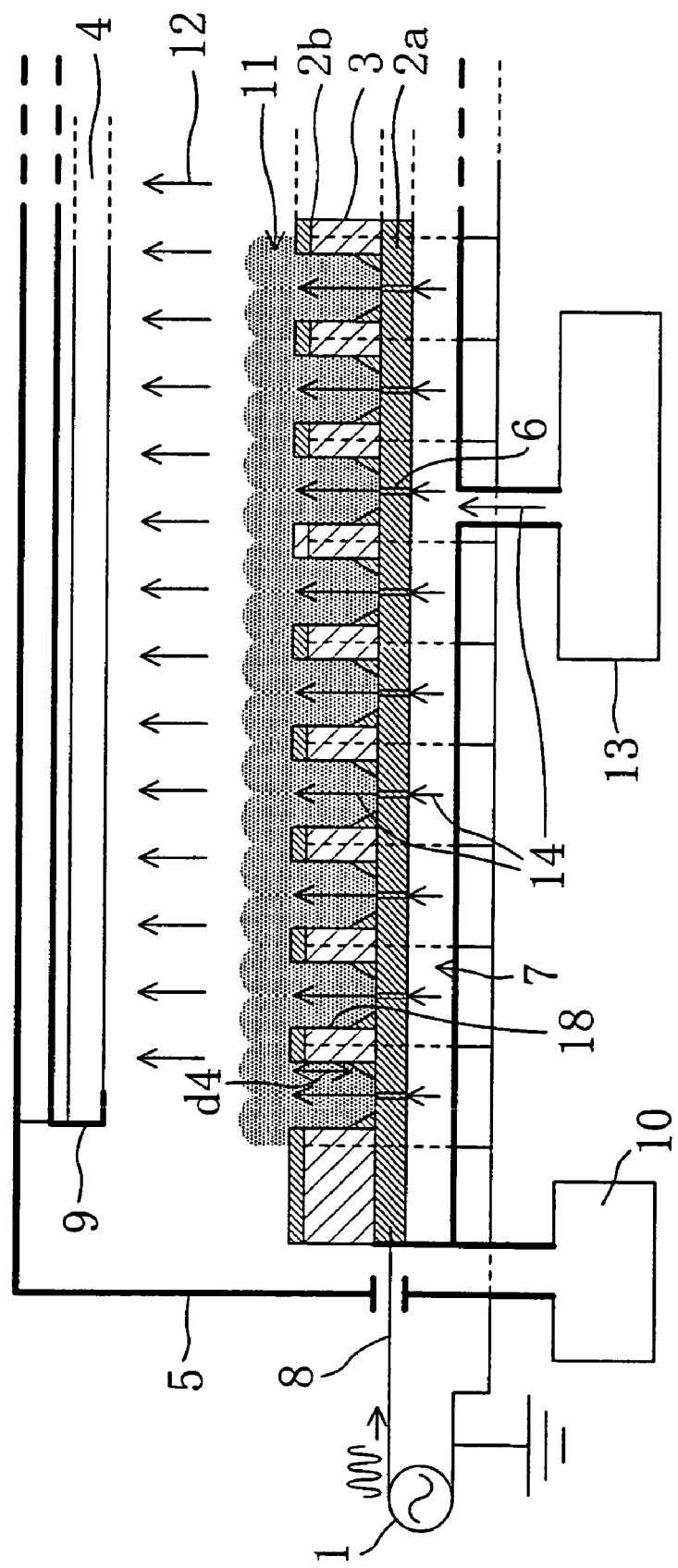
FIG. 7 is a cross-sectional view schematically showing the plasma CVD apparatus according to embodiment 2.
Figure 8:
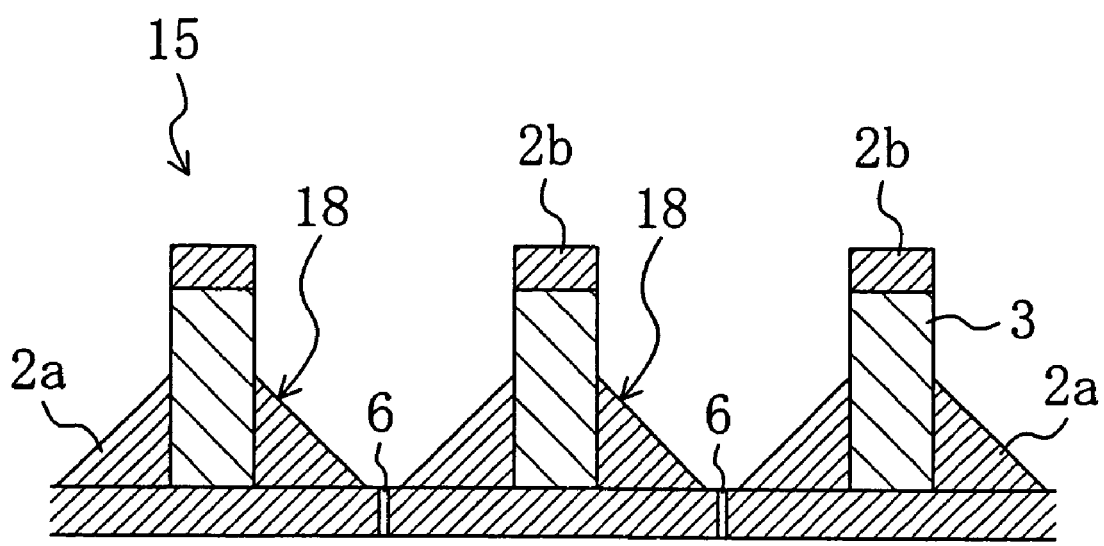
FIG. 8 is an enlarged cross-sectional view showing a part of the plasma discharge production section according to embodiment 2.

FIG. 6 is a perspective view schematically showing a plasma CVD apparatus according to embodiment 2 of the present invention. FIG. 7 is a cross-sectional view schematically showing the plasma CVD apparatus of embodiment 2. FIG. 8 is an enlarged cross-sectional view showing a part of the apparatus of FIG. 7. The plasma CVD apparatus of embodiment 2 is described with reference to FIGS. 6 through 8. In the following descriptions, components having substantially the same functions as those of the components of the plasma CVD of embodiment 1 are denoted by the same reference numerals used in embodiment 1, and descriptions thereof are herein omitted.

The plasma CVD apparatus of embodiment 2 is different from the plasma CVD of embodiment 1. In the apparatus of embodiment 2, the plasma discharge surface of the cathode electrode $2a$ includes a concaved surface, whereas in the apparatus of embodiment 1, the plasma discharge surface of the cathode electrode $2a$ is planar.

Referring to FIG. 8, the cathode electrode $2a$ in each trench 18 has a pair of sloped surfaces extending obliquely upward from positions near the gas inlets 6. In other words, the bottom of the trench 18 has a tapered cross section such that the width of the trench 18 in the cross section increases along a direction from the gas inlets 6 to the target substrate 4. The pair of sloped surfaces constitute the plasma discharge surface of the cathode electrode $2a$.

For example, in the fabrication of the plasma discharge production section 15 of embodiment 2, a large number of aluminum sticks each having a rectangular cross section and a length of 300 cm (hereinafter, "rectangular aluminum sticks") are prepared as the anode electrodes $2b$. An aluminum plate having a size of 110 cm×110 cm and a thickness of 3 mm is prepared as the cathode electrode $2a$. Further, a large number of aluminum sticks each having a right triangular cross section and a length of 100 cm (hereinafter, "triangular aluminum sticks") are prepared. The triangular aluminum sticks are fixed on a surface of the aluminum plate such that the vertical face of each triangular aluminum stick faces the vertical face of the adjacent triangular aluminum stick, and the triangular aluminum sticks extend generally in parallel to each other.

A space between the vertical faces of the adjacent triangular aluminum sticks is filled with an insulator of alumina. Thus, the interelectrode insulators 3 are sandwiched by the triangular aluminum sticks. The rectangular aluminum sticks are placed on the interelectrode insulators 3, whereby the rectangular aluminum sticks, which are to be the anode electrodes $2b$, are electrically insulated from the aluminum plate and triangular aluminum sticks which are to be the cathode electrode $2a$.

In the cross section that is generally orthogonal to the longitudinal direction of the anode electrodes $2b$, the width d1 of the anode electrodes $2b$ and the interelectrode insulators 3 is 5 mm, the width d2 of the cathode electrode $2a$ is 10 mm, the height d3 of the interelectrode insulators 3 is 10 mm, and the interval between the anode electrodes $2b$ and the interelectrode insulators 3 is 15 mm. The distance d4 between an upper edge of the cathode electrode $2a$ and the anode electrodes $2b$ is 5 mm. The width d5 of the bottom side of the triangular cross section of the cathode electrode $2a$ is 3 mm.

A radio frequency voltage is applied to the aluminum plate of the electrode substrate, whereby the aluminum plate and the triangular aluminum sticks function as the cathode electrode $2a$. The rectangular aluminum sticks insulated from the cathode electrode $2a$ by the interelectrode insulators 3 function as the anode electrodes $2b$.

The apparatus of embodiment 2 was used to form a silicon nitride film. The film formation rate was 0.6 nm (6 Å)/sec, and the film thickness uniformity over the plane of the film was ±3%. The reason that the film formation rate was increased is described below while comparing embodiment 2 with embodiment 1.

In embodiment 1, the surfaces (exposed surfaces) of the interelectrode insulators 3 which insulate the electrodes $2a$ and $2b$ are perpendicular to the surface of the cathode electrode $2a$, and therefore, plasma particles and radical particles generated at the surface of the cathode electrode $2a$ are likely to collide against the interelectrode insulators 3 to vanish away. On the other hand, in embodiment 2, due to the presence of the triangular aluminum sticks, an angle formed by the surface of the interelectrode insulators 3 and the sloped surface of the cathode electrode $2a$ is an obtuse angle and preferably is 180°. Thus, the possibility that plasma particles and radical particles generated at the surface of the cathode electrode $2a$ collide against the interelectrode insulators 3 to vanish away is decreased. Furthermore, since the cross section of the plasma discharge surface of the cathode electrode $2a$ has a concaved shape, the hollow cathode effect occurs. Thus, by shaping the plasma discharge surface of the cathode electrode $2a$ in a concaved shape, the throughput of the apparatus can be improved while maintaining the other properties, such as film quality, etc.

In the examples illustrated in embodiments 1 and 2, the plasma process apparatus of the present invention is embodied in the form of a plasma CVD apparatus. However, the plasma process apparatus of the present invention is not limited to the plasma CVD apparatus. The present invention is applicable to general plasma process apparatuses for performing a plasma process, such as thin film formation, process, etc., with plasma. For example, the present invention is preferably applicable to a dry etching apparatus and an asher apparatus.

For example, when the present invention is applied to a dry etching apparatus, an etching gas, such as $CF_4$, $SF_6$, $Cl_2$, HCl, $BCl_3$, $O_2$, or the like, is introduced into the process chamber 5. In the general dry etching apparatuses, not only radicals generated by plasma discharge but also ion impact against a target surface of a target substrate is sometimes utilized for an etching operation. For example, an electrode for controlling the ion impact is independently provided on a back surface of the target substrate 4. This electrode is connected to the power source to apply a predetermined potential to the target substrate 4, whereby ion impact is controlled.

By using the apparatus of the present invention, the gas is efficiently dissociated so that the etching rate is increased, and ion impact can be controlled independently of the plasma portion used for gas dissociation, thereby improving the controllability of ion impact.

In the examples described in embodiments 1 and 2, the anode electrodes $2b$ are closer to the target substrate 4 than the cathode electrode $2a$ is. However, according to the present invention, the cathode electrode 2a may be closer to the target substrate 4 than the anode electrodes 2b are. Furthermore, the potential level relationship between the anode electrode 2b and the cathode electrode 2a may be alternately inverted with the passage of time.

In the examples described in embodiments 1 and 2, the gas inlets 6 are formed in the cathode electrode 2a, but the positions of the gas inlets 6 are not limited thereto. For example, the gas inlets 6 may be provided between the plasma discharge production section 15 and the target substrate 4. In this case, the gas is introduced along a planar direction of the target substrate 4 through the gas inlets 6 into the process chamber 5.

(Embodiment 3)

Figure 9:
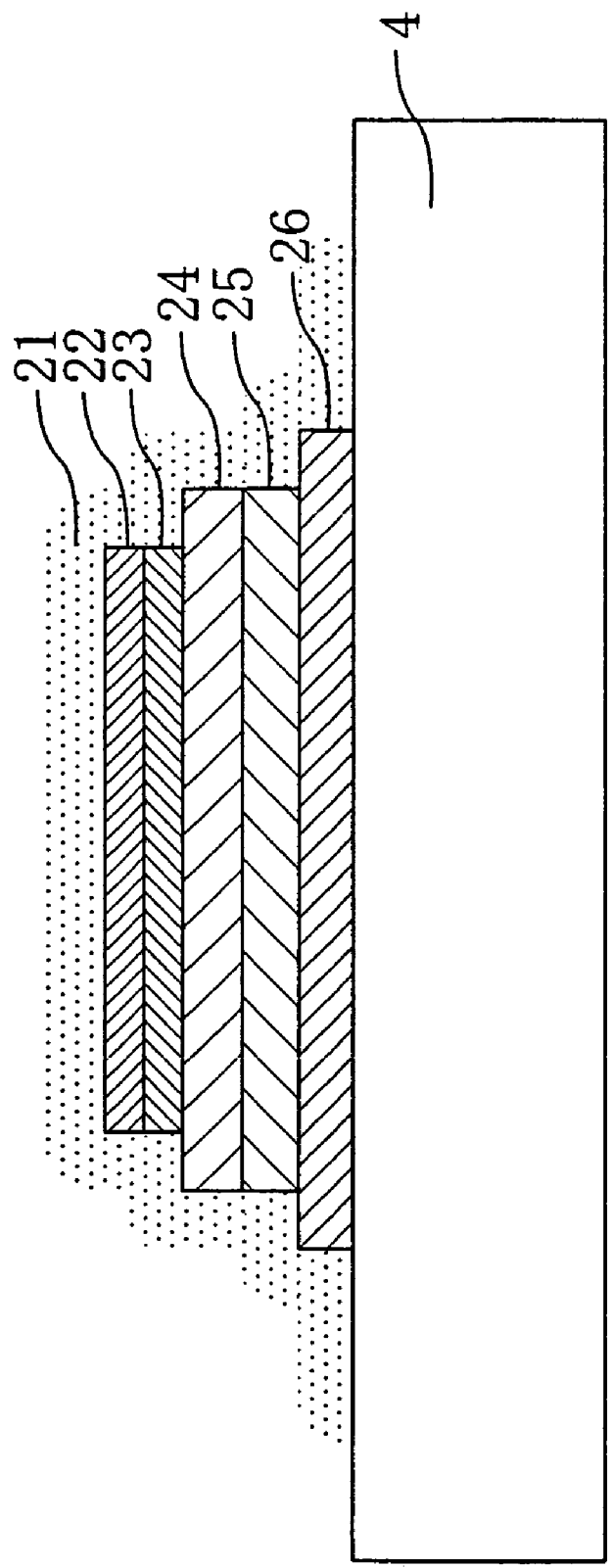
FIG. 9 is a cross-sectional view schematically showing an organic electroluminescence device.

An organic electroluminescence device, which is an electronic device actually fabricated using the plasma CVD apparatus of embodiment 1 or 2, is described below. FIG. 9 is a cross-sectional view schematically showing an organic electroluminescence device.

The electroluminescence device (hereinafter, simply referred to as "EL device") shown in FIG. 9 includes an anode 26 made of aluminum, an organic hole transport layer 25, an organic emission layer 24, a cathode 23 made of calcium, and a transparent electrode 22 made of indium tin oxide, which were formed on the target substrate 4 in this order. The films of the organic hole transport layer 25 and the organic emission layer 24 were formed of a diamine derivative ((1,1'-bis(4-di-p-tolylaminophenyl)cyclohexane; TPD) and 8-quinolinol aluminum complex (tris(8-hydroxyquinolinato)aluminum(III);Alq3), respectively, by using a vacuum deposition method.

The organic EL device of embodiment 3 further includes a transparent insulating film 21 as a protection film in the outermost layer. A silicon nitride film (thickness: 500 nm (5000 Å)) was formed as the transparent insulating film 21, thereby completing the electronic device. Hereinafter, this electronic device is referred to as "device a". The conditions for forming the silicon nitride film are the same as those described in embodiments 1 and 2, except that the temperature of the target substrate 4 is 80° C.

As comparative example 1, a silicon nitride film was formed using the parallel plate type apparatus shown in FIGS. 33 and 34 under the same conditions. An electronic device including this silicon nitride film as a protection film is referred to as "device b". As comparative example 2, an electronic device not including a protection film, wherein the layered structure is instead covered with a concaved glass substrate and sealed in a nitrogen atmosphere, was fabricated. This electronic device is referred to as "device c". Note that the structure of the device c is a commonly employed conventional structure.

Between the structures of the device a and the device c, there was no difference in both the emission characteristics in an early period and the long term emission characteristics. Thus, the electronic device of the present invention, which was fabricated without using a cover glass substrate, includes a protection film having desirable characteristics as those of the cover glass substrate. This means that the electronic device of the present invention has a higher throughput than that of a conventional electronic device including a cover glass substrate.

On the other hand, in the device b, a large number of black spots, which did not emit light, were produced during an operation test, resulting in a defective operation. The reason for this is estimated that a silicon nitride film formed by the parallel plate type apparatus is not suitable as a protection film so that the protection film allows oxygen in the atmosphere to pass therethrough.

The device described in embodiment 3 includes organic films. The film characteristics of the organic films are deteriorated by a thermal process at 100° C. or higher. Thus, it is desired to form a protection film having superior film characteristics even when the film formation is performed at a temperature in the vicinity of 100° C. According to the plasma process apparatus of the present invention, a protection film of high quality can be formed even when the temperature of the target substrate 4 is in the vicinity of 100° C. as described in embodiment 1. Thus, the device produced using the apparatus of the present invention possesses superior characteristics.

A film containing nitrogen, such as a silicon nitride film, a silicon nitride-oxide film, etc., is suitable as the protection film because the quality of the film containing nitrogen is readily maintained in a desirable state even when the temperature of the target substrate 4 is low. In the case where the film containing nitrogen has a rough film structure and hence has inferior protection film characteristics, a bond of silicon, nitrogen, and oxygen in the film is replaced by a bond of silicon and oxygen due to a water content in the atmosphere. Thus, the protection film containing nitrogen is advantageous in that the quality of the film can be checked by the Fourier transform infrared spectrum method, or the like. Moreover, the quality of the film can be easily monitored even during the formation thereof, and therefore, the throughput of a device including the film is high.

Although the device described in embodiment 3 includes organic films, the above-described film can be used as a protection film even in another type of device, for example, an electronic device not including an organic film, such as a solar cell device, a GaAs electronic device, etc.

In the electronic device of embodiment 3, the transparent insulating film 21 is formed as a protection film using the apparatus of embodiment 1 or 2. However, the electronic device of the present invention is not limited to a device produced using the plasma process apparatus of the present invention or a device produced using a production method of the present invention. Even a device produced using an apparatus or production method other than that of the present invention falls within the electronic device of the present invention so long as the device includes an insulating film containing silicon and nitrogen on an insulating substrate, and the bonded hydrogen content in the insulating film is $7 \times 10^{21}$ cm$^{-3}$ or greater.

Furthermore, an electronic device in which substantially no oxygen bond occurs inside an insulating film formed as the outermost layer during the operation of the device falls within the electronic device of the present invention regardless of a film formation apparatus and method employed for forming the insulating film.

According to the plasma process apparatus of the present invention, formation of a film on the target substrate and process of the film are performed with high quality and at a high gas dissociation efficiency. For example, in order to produce an active liquid crystal display, it is necessary to form a TFT portion using an amorphous silicon film, a silicon nitride film, and the like. If a plasma CVD apparatus is used in the production, plasma damage is prevented in the production process, and high gas dissociation efficiency is achieved. As a result, film formation can be performed in a parameter region which was not conventionally realized (for example, the substrate temperature of about 100° C.). Thus, fabrication of a TFT on a resin substrate, or the like, which was conventionally difficult to handle, becomes possible.

Alternatively, the present invention is applicable in the fields other than the field of liquid crystal displays. For example, an amorphous silicon film is formed as a light conversion layer of an amorphous silicon solar cell device using the plasma CVD method. The plasma process apparatus of the present invention achieves the same effects also in the field of amorphous silicon solar cell devices.

In the production of organic electroluminescence devices, polysilicon solar cell devices, gallium arsenide electronic devices, etc., the plasma process apparatus of the present invention is used as an apparatus for forming a transparent insulating film as a protection film in the outermost layer. Especially in the formation of a protection film for an organic electroluminescence device, the process temperature of 100° C. or lower is an indispensable condition. The apparatus of the present invention achieves formation of a high quality film even in such a temperature range. Furthermore, in the production of a polysilicon solar cell device, a protection film having the same characteristics can be formed at a lower process temperature. As a result, the stable operation of the apparatus and convenience of maintenance of the apparatus can be achieved.

In the process of producing an active liquid crystal display, if the plasma process apparatus of the present invention is used in a dry etching step for thin film patterning, high gas dissociation efficiency is achieved as well as high parameter controllability. Also when the plasma process apparatus of the present invention is alternatively applied to an asher apparatus, high gas dissociation efficiency is achieved as well as high parameter controllability. In both applications, high gas dissociation efficiency is achieved, and the process capacity of the apparatus is increased.

According to the present invention, an electronic device having a high quality protection film as the outermost layer is realized. Specifically, when the present invention is applied to an organic electroluminescence device including an organic film, or the like, a high quality protection film is formed at a process temperature of 100° C. or lower. Thus, the original characteristics of the organic film can be maintained. Furthermore, since it is not necessary to cover the upper portion of the device with a cover glass substrate, the device can be produced with high production yield. Thus, a thinner, lighter-weight organic electroluminescence display can be realized.

(Embodiment 4)

Figure 10:
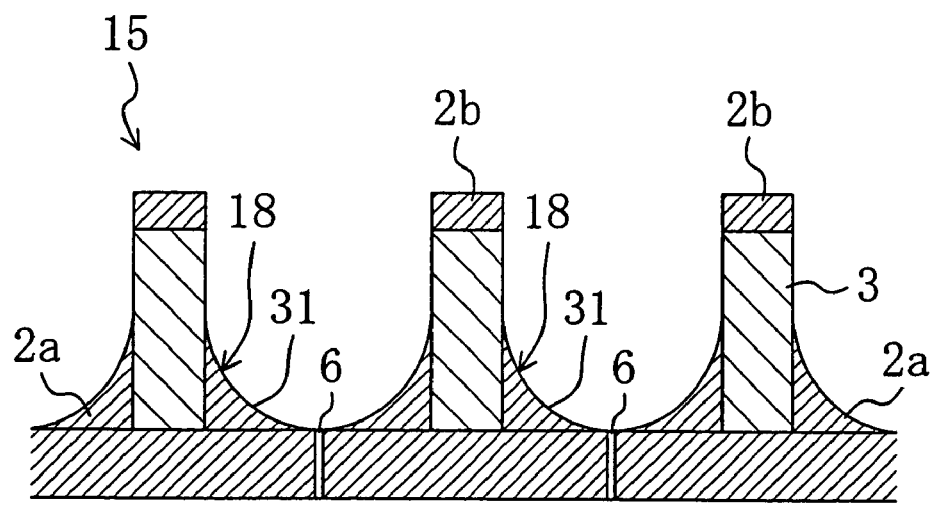
FIG. 10 is an enlarged cross-sectional view showing a part of a plasma discharge production section according to embodiment 4, which corresponds to the cross section shown in FIG. 8.

FIG. 10 is an enlarged cross-sectional view showing a part of a plasma discharge production section 15 according to embodiment 4 of the present invention.

In embodiment 4, the sloped surface of each trench 18 of embodiment 2 is modified into a curved surface 31 which is curved downward. That is, the plasma discharge surface of the cathode electrode 2a has concavely curved surfaces 31. The curved surface 31 has an arc-shaped cross section extending between side walls of the adjacent insulators 3, so that the trench 18 results in a U-shaped trench.

According to embodiment 4, the cross-sectional area of the trench 18 is larger than that of the trench of embodiment 2 which has sloped surfaces whose cross section is tapered. That is, a larger plasma region is produced in the vicinity of the cathode electrode 2a. As a result, the decomposed gas amount per unit gas flow rate and the gas decomposition efficiency per unit gas flow rate are increased, and accordingly, the film formation rate and the film quality are improved.

In general, if a stream of the gas introduced from the gas inlets 6 stagnates, powders are readily generated in the stagnant region. On the other hand, in embodiment 4, the surface of the cathode electrode 2a has a concavely curved surface in the vicinity of the gas inlets 6, whereby the gas stream smoothly flows, and generation of powders is suppressed. As a result, intrusion of powders into the film is suppressed, and accordingly, the film quality is improved.

In order to assess the quality of a formed film and the film formation rate, the membrane stress (the residual stress of a SiN film) and the etching rate were actually measured. The results of the measurement are shown in Table 2.

TABLE 2

| | Membrane stress (Mpa) | Etching rate (Å/s) |
| --- | --- | --- |
| Example 1 | 563 | 271 |
| Example 2 | 473 | 256 |

Example 1 is the structure of embodiment 2 shown in FIG. 8, which includes sloped surfaces having a tapered cross section. Example 2 is the structure of embodiment 4 shown in FIG. 10, which includes the curved surfaces 31. Measurements of the membrane stress and the etching rate are performed on Examples 1 and 2. In the measurement of the membrane stress, a SiN (silicon nitride) film was formed on a Si wafer, and the warpage in the substrate was measured using a known stress measurement apparatus before and after the formation of the film. In the measurement of the etching rate, the etching rate (at atmospheric temperature) for SiN on the Si wafer with 1/100-diluted BHF (buffered hydrogen fluoride) was measured using a known step measurement apparatus.

The cross-sectional area of the trench 18 of example 2 was two times larger than that of example 1. The membrane stress of example 2 was about 16% smaller than that of example 1. The etching rate of example 2 was about 5.5% lower than that of example 1. That is, by shaping the plasma discharge surface into a concavely curved surface, the membrane stress is reduced, and the etching rate is decreased. As a result, a more uniform film surface is achieved.

(Embodiment 5)

Figure 11:
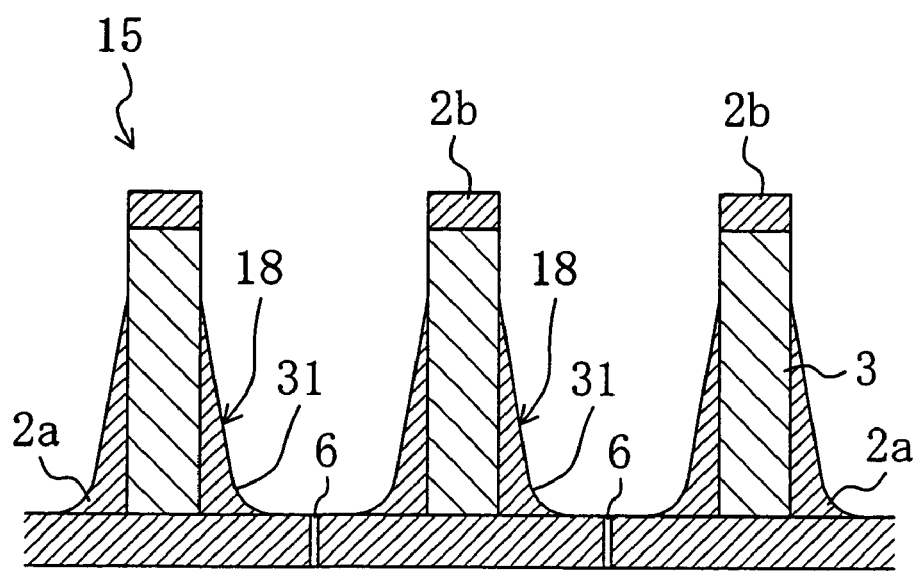
FIG. 11 is an enlarged cross-sectional view showing a part of a plasma discharge production section according to embodiment 5, which corresponds to the cross section shown in FIG. 10.

FIG. 11 is an enlarged cross-sectional view showing a part of a plasma discharge production section 15 according to embodiment 5 of the present invention, which corresponds to the cross section shown in FIG. 10.

In embodiment 5, the depth of the trench 18 is relatively increased, such that the ratio of the trench depth to the trench width is larger than that of embodiment 2. That is, the depth of the trench 18 is greater than its width. The curved surface 31 continually extends over the side surfaces and the bottom surface of the trench 18. Also with this structure, the same effects as those of embodiment 4 are achieved. Furthermore, since in embodiment 5 the cross-sectional area of the trench 18 is larger than that of embodiment 4, the gas decomposition amount and the gas decomposition efficiency are improved, and the film quality is further improved.

(Embodiment 6)

Figure 12:
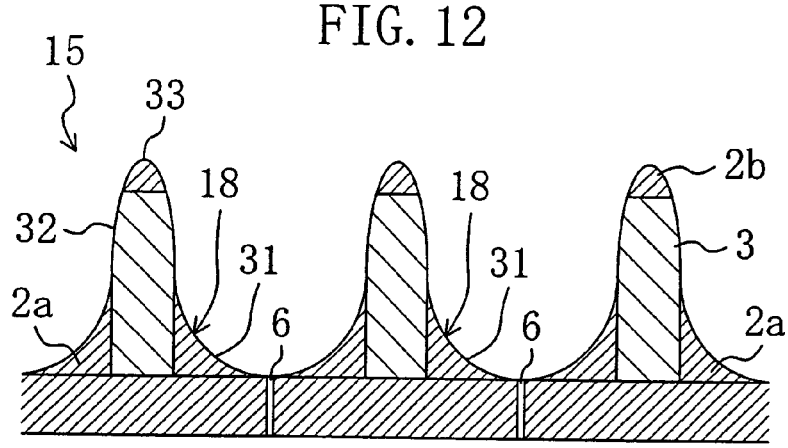
FIG. 12 is an enlarged cross-sectional view showing a part of a plasma discharge production section according to embodiment 6, which corresponds to the cross section shown in FIG. 10.

FIG. 12 is an enlarged cross-sectional view showing a part of a plasma discharge production section 15 according to embodiment 6 of the present invention, which corresponds to the cross section shown in FIG. 10.

In embodiment 6, each of the anode electrodes 2b also has a curved surface in addition to the curved surface of the trench 18 of embodiment 4. The plasma discharge surface of the cathode electrode 2a and the plasma discharge surfaces of the anode electrodes 2b constitute portions of a continuously curved surface. The continuously curved surface is formed by the concavely curved surfaces 31 of the cathode electrode 2a, curved side walls 32 of the insulators 3, and the convexly curved surfaces 33 of the anode electrodes 2b. In other words, a surface of the plasma discharge production section 15 which is closer to the target substrate 4 is shaped so as to have a continuously undulated surface.

In embodiment 4, the shapes of the anode electrodes 2b and the insulators 3 are simple and therefore readily formed. However, there is a possibility that an electric field is concentrated at the edges of the anode electrodes 2b to cause abnormal discharge. On the other hand, in embodiment 6, the anode electrodes 2b have curved surfaces. Thus, concentration of an electric field is prevented, and generation of powders due to abnormal discharge is suppressed. As a result, the film quality is further improved.

(Embodiment 7)

Figure 13:
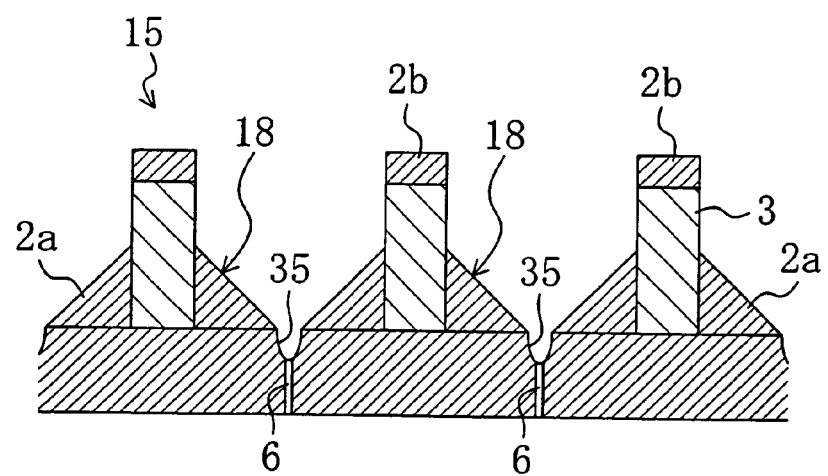
FIG. 13 is an enlarged cross-sectional view showing a part of a plasma discharge production section according to embodiment 7, which corresponds to the cross section shown in FIG. 10.

FIG. 13 is an enlarged cross-sectional view showing a part of a plasma discharge production section 15 according to embodiment 7 of the present invention, which corresponds to the cross section shown in FIG. 10.

In embodiment 7, grooves 35 are provided in the area in which the gas inlets 6 are formed. In other words, the plasma discharge surface of the cathode electrode 2a includes a plurality of grooves 35 which are arranged so as to extend along the longitudinal direction of the trenches 18. At the bottom of each groove 35, the gas inlets 6 are formed in a line.

Thus, according to embodiment 7, the hollow cathode effect occurs in each groove 35. Therefore, the amount of electrons which come out of the cathode electrode 2a is increased, and decomposition of the gas is further accelerated. That is, the decomposed gas amount per unit gas flow rate and the gas decomposition efficiency per unit gas flow rate are increased, and accordingly, the film formation rate and the film quality are improved. Furthermore, since the gas inlets 6 through which the gas is introduced are provided at the bottom of the grooves 35, an undesirable film is not attached to the inside walls of the grooves 35.

(Embodiment 8)

Figure 14:
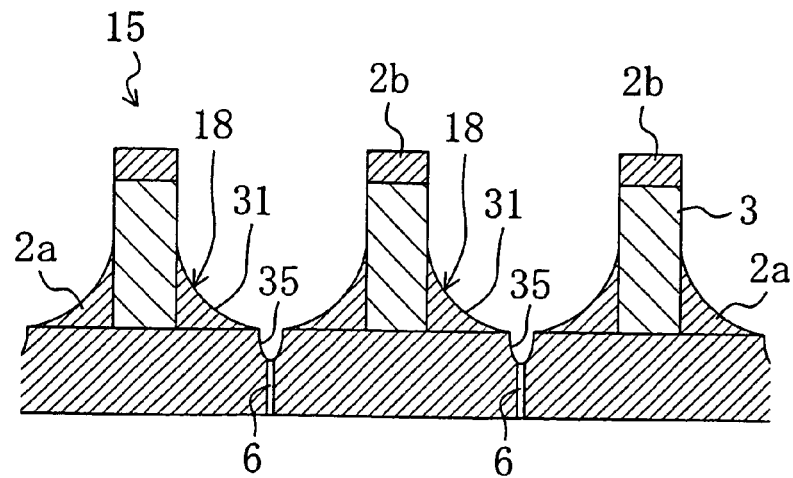
FIG. 14 is an enlarged cross-sectional view showing a part of a plasma discharge production section according to embodiment 8, which corresponds to the cross section shown in FIG. 10.

FIG. 14 is an enlarged cross-sectional view showing a part of a plasma discharge production section 15 according to embodiment 8, which corresponds to the cross section shown in FIG. 10. Embodiment 8 further includes grooves 35 in addition to the structure of embodiment 2. The grooves 35 are provided in the area in which the gas inlets 6 are formed as in embodiment 7.

With such a structure, embodiment 8 achieves the same effects as those of embodiment 7. In addition to such a feature, the cross-sectional area of the trench 18 is increased such that a larger plasma region is achieved. As a result, the film formation rate and the film quality are improved.

(Embodiment 9)

Figure 15:
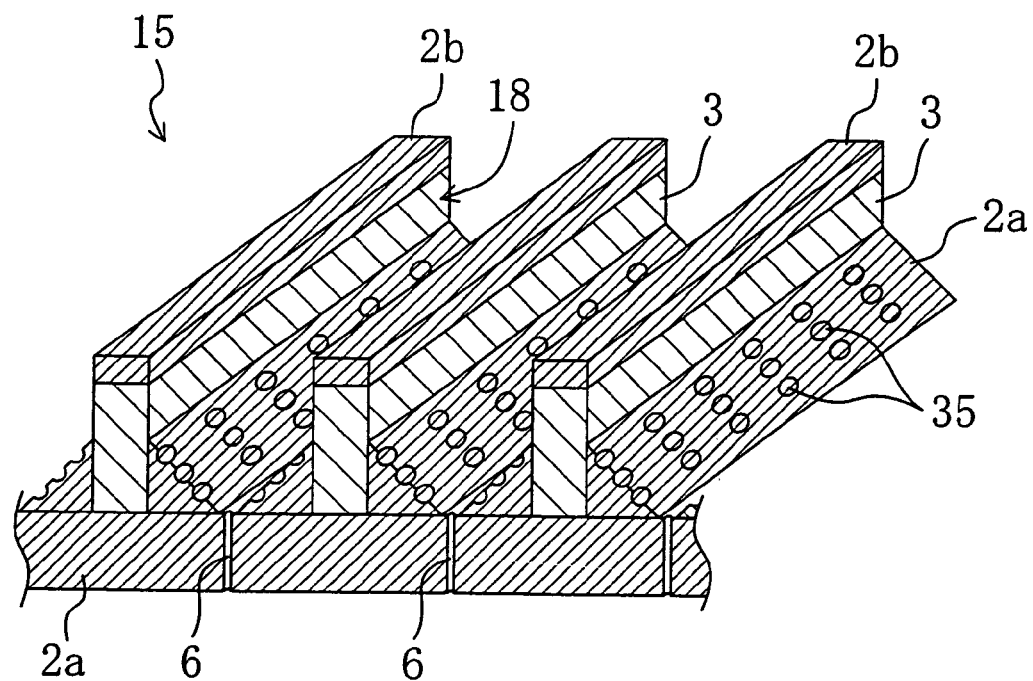
FIG. 15 is a perspective view showing a plasma discharge production section according to embodiment 9.

FIG. 15 is an enlarged perspective view showing a plasma discharge production section 15 according to embodiment 9 of the present invention.

Embodiment 9 further includes a plurality of dimples 35 in addition to the structure of embodiment 2. The dimples 35 are formed in the sloped surfaces of the trench 18 of the cathode electrode 2a so as to be arranged along the width direction and longitudinal direction of the trench 18.

In embodiment 9, the entire structure of the generally V-shaped cathode electrode 2a causes the hollow cathode effect, while the hollow cathode effect occurs in each dimple 35 of the plasma discharge surface, whereby a larger amount of electrons are released. As a result, the gas is efficiently decomposed, and accordingly, the film quality is improved.

At a certain height above the plasma discharge surface, a cathode sheath portion which is not a plasma region is formed. Since the gas supplied from the gas inlets 6 quickly passes through the cathode sheath portion, the gas stream does not stagnate in the plasma region even when a large number of dimples 35 are formed in the plasma discharge surface.

(Embodiment 10)

Figure 16:
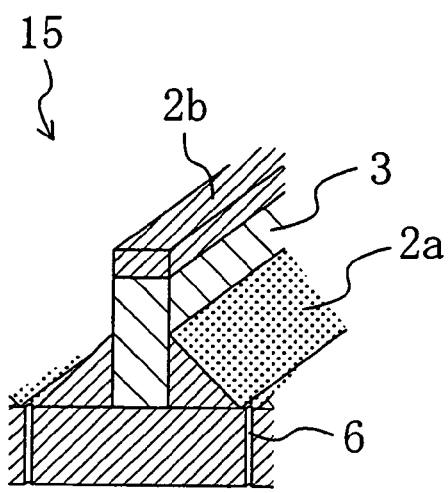
FIG. 16 is an enlarged perspective view showing a plasma discharge production section according to embodiment 10.

FIG. 16 is an enlarged perspective view showing a part of a plasma discharge production section 15 according to embodiment 10 of the present invention.

In embodiment 10, the plasma discharge surface of the cathode electrode 2a of embodiment 9 is sandblasted instead of being provided with the dimples 35. The plasma discharge surface of the cathode electrode 2a has relatively large roughness. Microscopically, the plasma discharge surface has a large number of concavities and convexities. Thus, the hollow cathode effect is caused on the sandblasted plasma discharge surface of the cathode electrode 2a, thereby improving the film quality.

(Embodiment 11)

Figure 17:
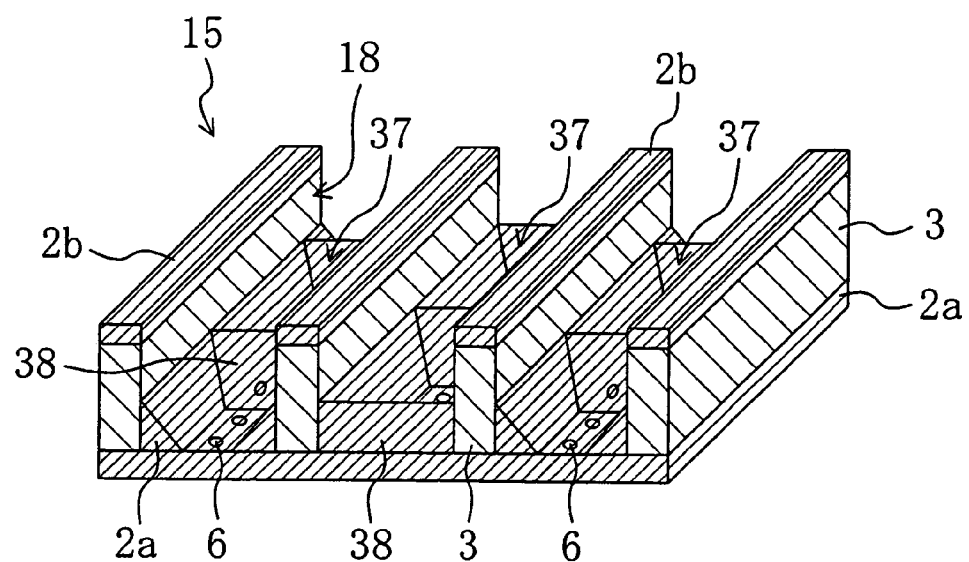
FIG. 17 is a perspective view showing a plasma discharge production section according to embodiment 11.
Figure 18:
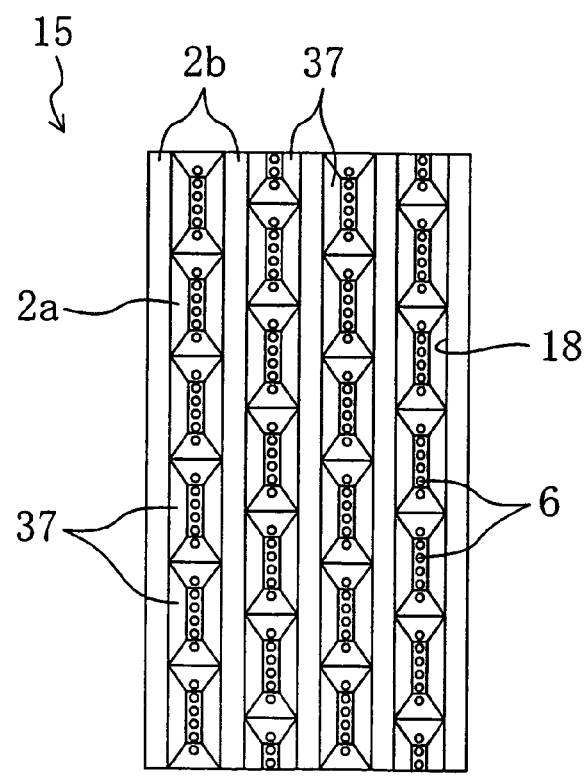
FIG. 18 is a plan view showing the plasma discharge production section according to embodiment 11.

FIG. 17 is an enlarged perspective view showing a plasma discharge production section 15 according to embodiment 11 of the present invention. FIG. 18 is a plan view showing the plasma discharge production section 15 of embodiment 11.

In embodiment 11, a plurality of pits 37 which are opened onto the target substrate 4 are formed in the cathode electrode 2a between adjacent insulators 3 so as to align at the bottom of each trench 18 along the longitudinal direction of the trench 18. In other words, embodiment 11 includes, in addition to the structure of embodiment 2, partitions 38 for separating the trench 18, which are provided along the longitudinal direction of the trench 18 at a predetermined interval.

Thus, the pit 37 has a rectangular opening and is defined by the bottom surface of the trench 18, a pair of sloped surfaces of the cathode electrode 2a, and a pair of separation surfaces of the partitions 38. The separation surfaces of the partitions 38 is slanted such that lower part of the partition 38 is wider along the longitudinal direction of the trench 18. Therefore, the horizontal cross section of the opening of the pit 37 gradually decreases from top to bottom.

As shown in FIG. 18, the plurality of pits 37 between the insulators 3 are provided in a staggered arrangement when seen in the normal line direction of the target substrate 4. In each pit 37, a plurality of gas inlets 6 are provided in the bottom of the trench 18 and the separation surfaces of the partitions 38 so as to align along the longitudinal direction of the trench 18.

Thus, according to embodiment 11, the surface area of the cathode electrode 2a is increased, and accordingly, the gas decomposition efficiency and the film formation rate are improved. Furthermore, the pits 37 are provided in a staggered arrangement, and therefore, the quality of a film formed on the target substrate 4 is uniform. It should be noted that the shape of the pit is not limited to a rectangular shape but may be any other polygonal shape, such as an octagonal shape, or the like.

(Embodiment 12)

Figure 19:
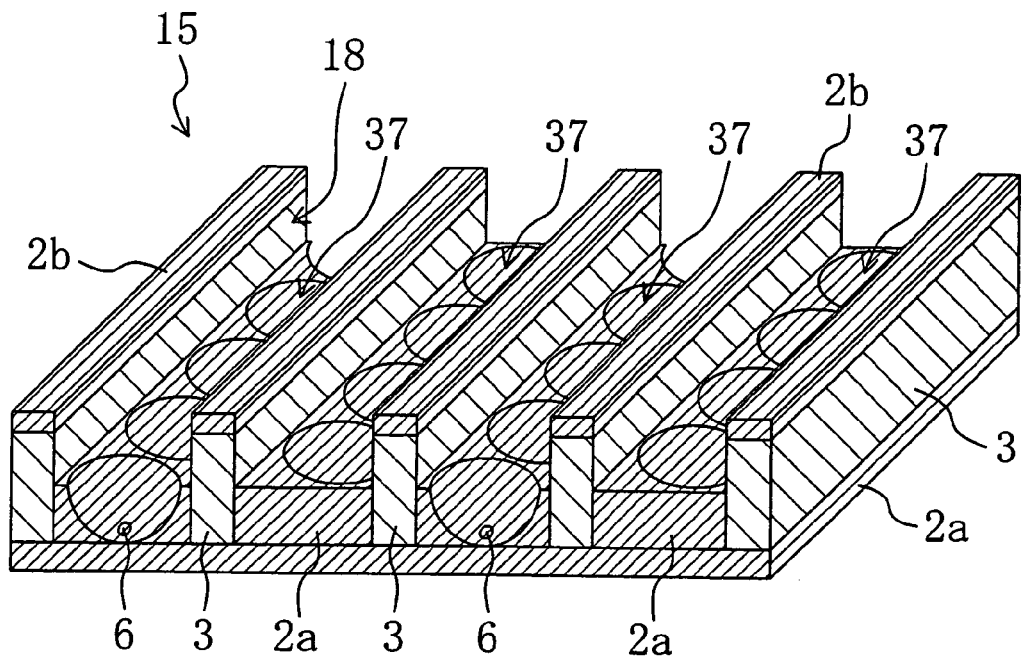
FIG. 19 is a perspective view showing a plasma discharge production section according to embodiment 12.
Figure 20:
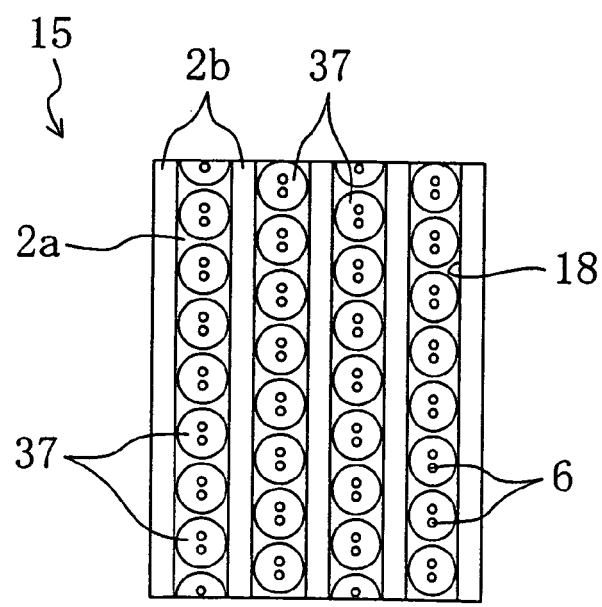
FIG. 20 is a plan view showing the plasma discharge production section according to embodiment 12.

FIG. 19 is an enlarged perspective view showing a plasma discharge production section 15 according to embodiment 12 of the present invention. FIG. 20 is a plan view showing the plasma discharge production section 15 of embodiment 12.

In embodiment 12, the shape of the opening of the pit 37 of embodiment 11 is changed to a circular shape. That is, a plurality of bowl-shaped pits 37 are provided at the bottom of the trench 18 so as to align along the longitudinal direction of the trench 18. Small intervals are provided between the adjacent pits 37. In the bottom of each pit 37, for example, two gas inlets 6 are formed along the longitudinal direction of the trench 18.

Even when the opening of the pit 37 has a circular shape, the same effects as those of embodiment 11 are achieved. In addition, the inside surface of the pit 37 is formed by a curved surface, and therefore, a stream of the gas introduced through the gas inlets 6 is smooth.

It should be noted that the shape of the opening of the pit 37 is not limited to a perfect circle but may be an oval shape. Moreover, a plurality of pits 37 may be provided along the trench width direction in each trench 18.

(Embodiment 13)

Figure 21:
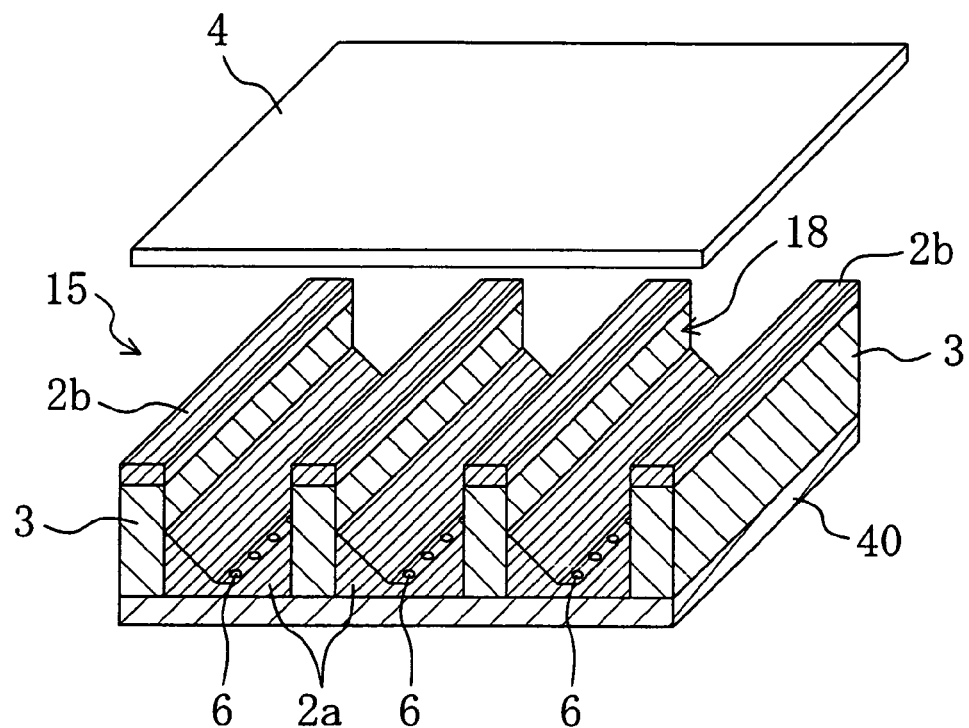
FIG. 21 is a perspective view showing a plasma discharge production section and a target substrate 4 according to embodiment 13.
Figure 22:
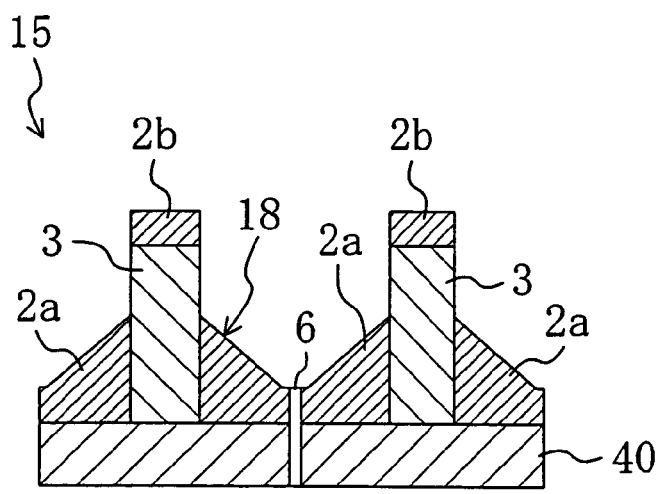
FIG. 22 is an enlarged cross-sectional view of the plasma discharge production section according to embodiment 13.

FIG. 21 is a perspective view showing a plasma discharge production section 15 and a target substrate 4 according to embodiment 13 of the present invention. FIG. 22 is an enlarged cross-sectional view showing a portion of the plasma discharge production section 15 of embodiment 13.

Embodiment 13 is different from embodiment 2 in that the cathode electrode 2a is separated by the insulators 3 into a plurality of cathode electrode divisions 2a such that the cathode electrode divisions 2a are electrically insulated from each other. As shown in FIGS. 21 and 22, the plasma discharge production section 15 is formed by an insulating plate 40 provided in parallel to the target substrate 4, a plurality of insulators 3 provided on the insulating plate 40 in a stripe pattern, the cathode electrode divisions 2a provided between the adjacent insulators 3, and the anode electrodes 2b provided on the top ends of the insulators 3.

Thus, also in embodiment 13, as shown in FIG. 22, the trench 18 is defined by the adjacent insulators 3, the two side surfaces of the anode electrodes 2b, and the upper surface of the cathode electrode 2a. The gas inlets 6 are formed so as to penetrate through the cathode electrode 2a and the insulating plate 40. Moreover, the cathode electrode 2a has a slanted plasma discharge surface as in embodiment 2. Also with such a structure, the same effects as those of embodiment 2 are achieved.

(Embodiment 14)

Figure 23:
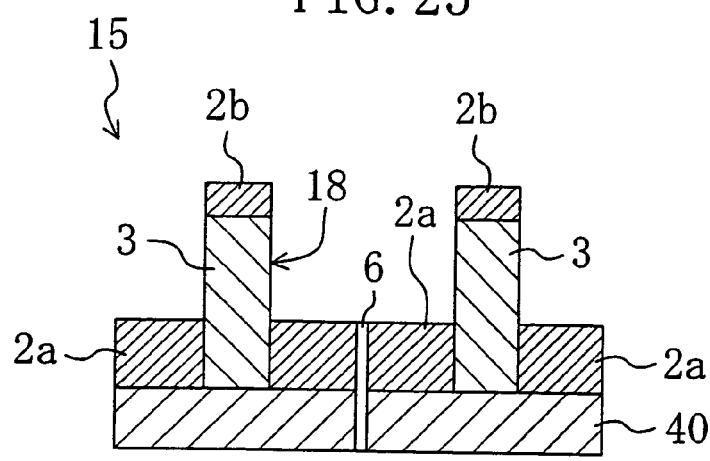
FIG. 23 is an enlarged cross-sectional view of a plasma discharge production section according to embodiment 14, which corresponds to the cross section shown in FIG. 22.

FIG. 23 is an enlarged cross-sectional view showing a portion of a plasma discharge production section 15 according to embodiment 14 of the present invention.

Embodiment 14 is different from embodiment 13 in that the plasma discharge surface of the cathode electrode 2a is formed by a planar surface parallel to the target substrate 4 as in embodiment 1. The adjacent cathode electrode divisions 2a are electrically insulated by the insulator 3. Also with such a structure, the same effects as those of embodiment 1 are achieved.

(Embodiment 15)

Figure 24:
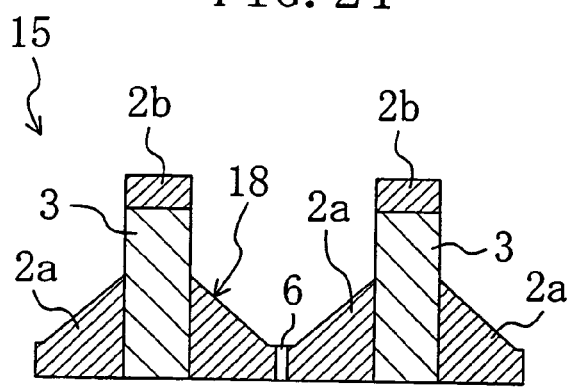
FIG. 24 is an enlarged cross-sectional view of a plasma discharge production section according to embodiment 15, which corresponds to the cross section shown in FIG. 22.
Figure 25:
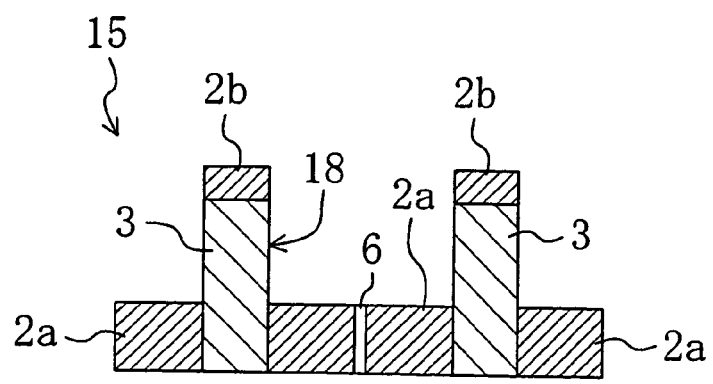
FIG. 25 is an enlarged cross-sectional view of a plasma discharge production section according to embodiment 15, which corresponds to the cross section shown in FIG. 22.

FIGS. 24 and 25 are enlarged cross-sectional views showing a portion of a plasma discharge production section 15 according to embodiment 15 of the present invention.

The structures shown in FIGS. 24 and 25 are substantially the same as the structure of embodiments 13 and 14, respectively, except that the insulating plate 40 is not provided in embodiment 15. The structure of FIG. 24 corresponds to the upper part of the plasma discharge production section 15 of embodiment 13 shown in FIG. 22. The structure of FIG. 25 corresponds to the upper part of the plasma discharge production section 15 of embodiment 14 shown in FIG. 23. Also with such a structure, the same effects as those of embodiment 1 or 2 are achieved.

(Embodiment 16)

Figure 26:
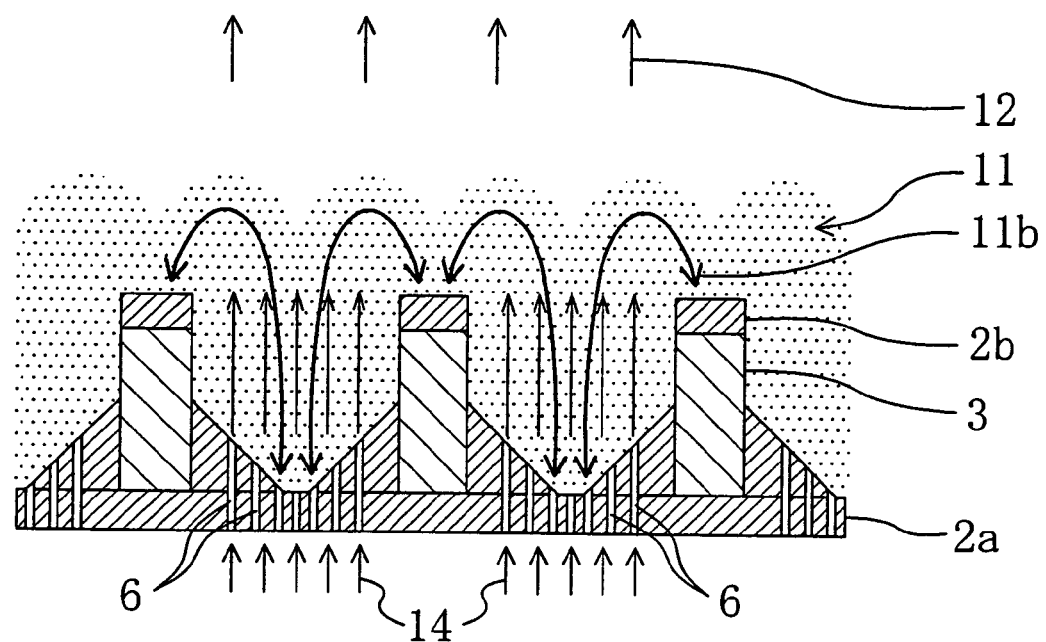
FIG. 26 illustrates discharge routes that are taken when the source gas pressure is relatively high according to embodiment 16.
Figure 27:
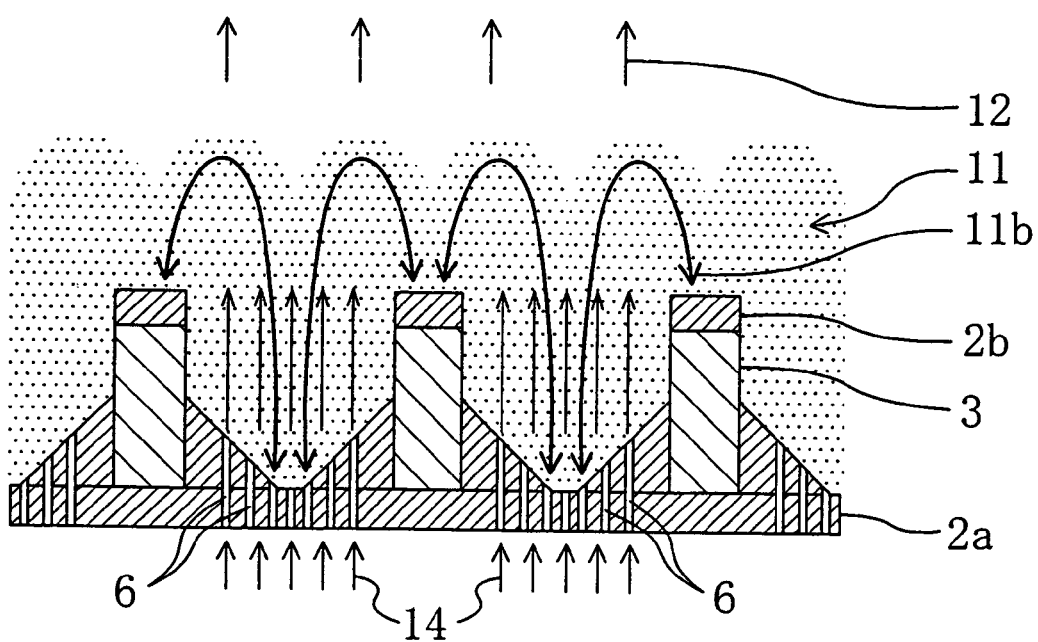
FIG. 27 illustrates discharge routes that are taken when the source gas pressure is relatively low according to embodiment 16.

FIGS. 26 and 27 are enlarged cross-sectional views showing a portion of a plasma discharge production section 15 according to embodiment 16 of the present invention. FIG. 26 shows discharge routes that are taken when the gas pressure is relatively high. FIG. 27 shows discharge routes that are taken when the gas pressure is relatively low.

Embodiment 6 is different from embodiment 2 in the arrangement of the gas inlets 6. In embodiment 6, a plurality of gas inlets 6 are aligned along a direction that is not parallel to the longitudinal directions of the striped insulators 3. Preferably, the plurality of gas inlets 6 are aligned along a direction perpendicular to the longitudinal direction of the insulators 3 (i.e., trench width direction) at a predetermined interval as shown in FIG. 26. A plurality of groups of gas inlets 6 aligned along the trench width direction are positioned at a predetermined interval along the longitudinal direction of the trench 18. Thus, the gas inlets 6 are arranged in a matrix over the plasma discharge production section 15 at the bottom of the trenches 18 when seen in the normal line direction of the target substrate 4.

The gas inlets 6 provided in the sloped surfaces of the cathode electrode 2a are designed so as to emit gas in directions parallel to each other. The gas inlets 6 are bored in the cathode electrode 2a along the normal line direction of the target substrate 4.

In the case where the gas inlets 6 are provided at the bottom of the trench 18 on the center line running along the longitudinal direction of the trench 18, there is a possibility that the distribution of gas streams along the trench width direction becomes uneven. For example, in the central area of the trench 18, the gas streams are laminar and therefore relatively fast, while in the areas near the insulators 3, the gas streams are turbulent and therefore relatively slow. The turbulent gas streams cause generation of powders.

In embodiment 16, a plurality of gas inlets 6 which emit gas in directions parallel to each other are provided along the trench width direction at a predetermined interval, and a plurality of groups of gas inlets 6 are provided at a predetermined interval along the longitudinal direction of the trench 18. Thus, uniform and laminar gas streams are achieved inside the trench 18. That is, according to embodiment 16, occurrence of a turbulent stream in the plasma region is prevented, whereby generation of powders is suppressed. Therefore, the film quality is improved.

In embodiment 16, a plurality of gas inlets 6 are provided along the width direction of the trench 18, whereby the total number of the gas inlets 6 provided in the plasma discharge production section 15 is increased. Thus, in the case where the gas is introduced into the process chamber 5 at a constant flow rate, the gas introduction speed is decreased, and accordingly, the gas residence time in the plasma region in the trench 18 is increased. Moreover, the gas streams spurting from the plurality of gas inlets 6 in directions parallel to each other flow along the plasma discharge routes. As a result, dissociation and decomposition of the gas are appropriately accelerated, and the film quality is further improved.

(Embodiment 17)

Figure 28:
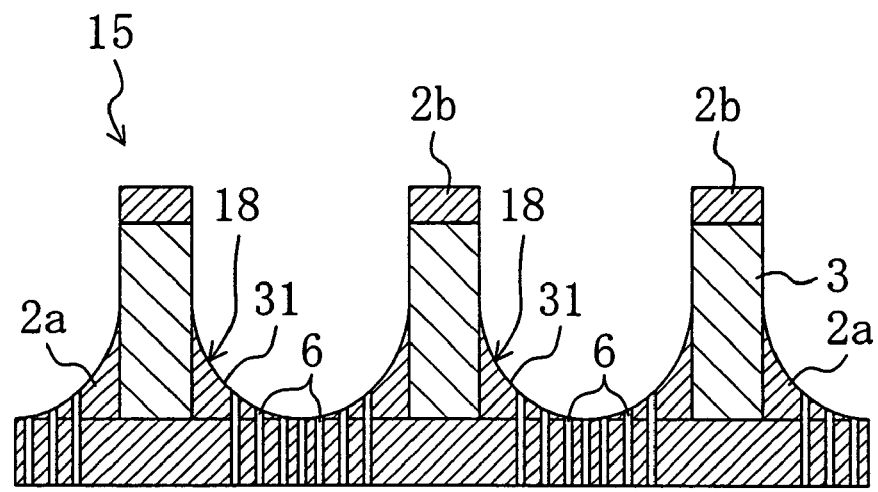
FIG. 28 is an enlarged cross-sectional view of a plasma discharge production section according to embodiment 17.

FIG. 28 is a schematic cross-sectional view of a plasma CVD apparatus according to embodiment 17 of the present invention. The plasma CVD apparatus of embodiment 17 is described with reference to FIG. 28.

In embodiment 17, the sloped surface of each trench 18 of embodiment 16 is modified into a curved surface 31 which is curved downward. That is, the plasma discharge surface of the cathode electrode 2a has concavely curved surfaces 31. The curved surface 31 has an arc-shaped cross section extending between side walls of the adjacent insulators 3, so that the trench 18 results in a U-shaped trench.

According to embodiment 17, the cross-sectional area of the trench 18 is larger than that of the trench of embodiment 16 which has sloped surfaces whose cross section is tapered. That is, a larger plasma region is produced in the vicinity of the cathode electrode 2a. As a result, the decomposed gas amount per unit gas flow rate and the gas decomposition efficiency per unit gas flow rate are increased, and accordingly, the film formation rate and the film quality are improved.

In general, if a stream of the gas introduced from the gas inlets 6 stagnates, powders are readily generated in the stagnant region. On the other hand, in embodiment 17, the surface of the cathode electrode 2a has a concavely curved surface in the vicinity of the gas inlets 6, whereby the gas stream smoothly flows, and generation of powders is suppressed. As a result, intrusion of powders into the film is suppressed, and accordingly, the film quality is improved.

In order to assess the quality of a formed film and the film formation rate, the membrane stress (the residual stress of a SiN film) and the etching rate were actually measured. The results of the measurement are shown in Table 3.

TABLE 3

|  | Membrane stress (Mpa) | Etching rate (Å/s) |
| --- | --- | --- |
| Example 3 | 473 | 256 |
| Example 4 | 436 | 162 |

Example 3 is the structure which is the same as that of FIG. 28, except that the gas inlets 6 are aligned at the bottom of the trench 18 on the center line running along the longitudinal direction of the trench 18. Example 4 is the structure of embodiment 17 shown in FIG. 28, which includes the curved surfaces 31. Measurements of the membrane stress and the etching rate are performed on Examples 3 and 4. In the measurement of the membrane stress, a SiN (silicon nitride) film was formed on a Si wafer, and the warpage in the substrate was measured using a known stress measurement apparatus before and after the formation of the film. In the measurement of the etching rate, the etching rate (at atmospheric temperature) for SiN on the Si wafer with $\frac{1}{100}$-diluted BHF (buffered hydrogen fluoride) was measured using a known step measurement apparatus.

The total area of the openings of the plurality of the gas inlets 6 in example 4 was 5 times larger than that in example 3. The membrane stress of example 4 was about 7.8% smaller than that of example 3. The etching rate of example 4 was about 37% lower than that of example 3. That is, by shaping the plasma discharge surface into a concavely curved surface, the membrane stress is reduced, and the etching rate is decreased. As a result, a more uniform film surface is achieved.

(Embodiment 18)

Figure 29:
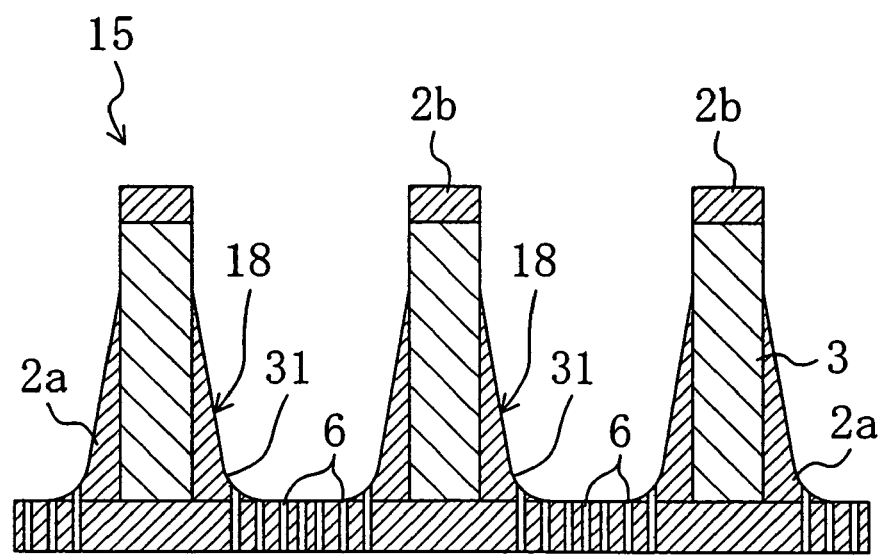
FIG. 29 is an enlarged cross-sectional view of a plasma discharge production section according to embodiment 18.

FIG. 29 is a schematic cross-sectional view showing a plasma CVD apparatus according to embodiment 18 of the present invention. The plasma CVD apparatus of embodiment 18 is described with reference to FIG. 29 while comparing with the structure of embodiment 17 shown in FIG. 28.

In embodiment 18, the depth of the trench 18 is relatively increased, such that the ratio of the trench depth to the trench width is larger than that of embodiment 17. That is, the depth of the trench 18 is greater than its width. The curved surface 31 continually extends over the side surfaces and the bottom surface of the trench 18. Also with this structure, the same effects as those of embodiment 17 are achieved. Furthermore, since in embodiment 18 the cross-sectional area of the trench 18 is larger than that of embodiment 17, the gas decomposition amount and the gas decomposition efficiency are improved, and the film quality is further improved.

(Embodiment 19)

Figure 30:
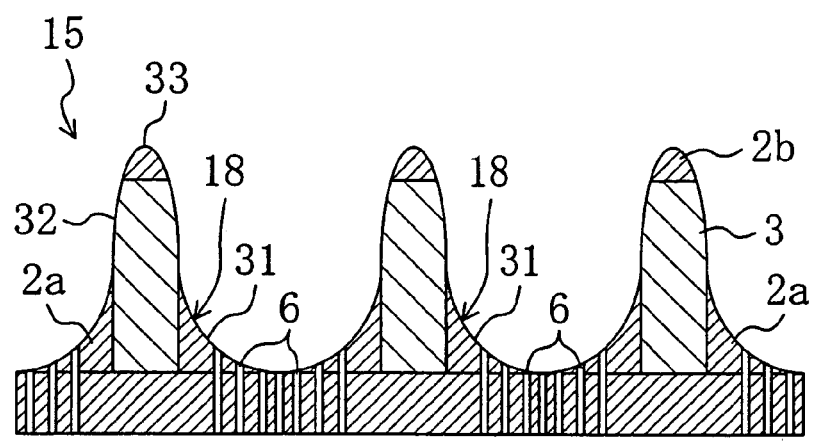
FIG. 30 is an enlarged cross-sectional view of a plasma discharge production section according to embodiment 19.

FIG. 30 is an enlarged cross-sectional view showing a part of a plasma discharge production section 15 according to embodiment 19 of the present invention.

In embodiment 19, each of the anode electrodes 2b also has a curved surface in addition to the curved surface of the trench 18 of embodiment 17. The plasma discharge surface of the cathode electrode 2a and the plasma discharge surfaces of the anode electrodes 2b constitute portions of a continuously curved surface. The continuously curved surface is formed by the concavely curved surfaces 31 of the cathode electrode 2a, curved side walls 32 of the insulators 3, and the convexly curved surfaces 33 of the anode electrodes 2b. In other words, a surface of the plasma discharge production section 15 which is closer to the target substrate 4 is shaped so as to have a continuously undulated surface.

In embodiment 17, the shapes of the anode electrodes 2b and the insulators 3 are simple and therefore readily formed. However, there is a possibility that an electric field is concentrated at the edges of the anode electrodes 2b to cause abnormal discharge. On the other hand, in embodiment 19, the anode electrodes 2b have curved surfaces. Thus, concentration of an electric field is prevented, and generation of powders due to abnormal discharge is suppressed. As a result, the film quality is further improved.

(Embodiment 20)

Figure 31:
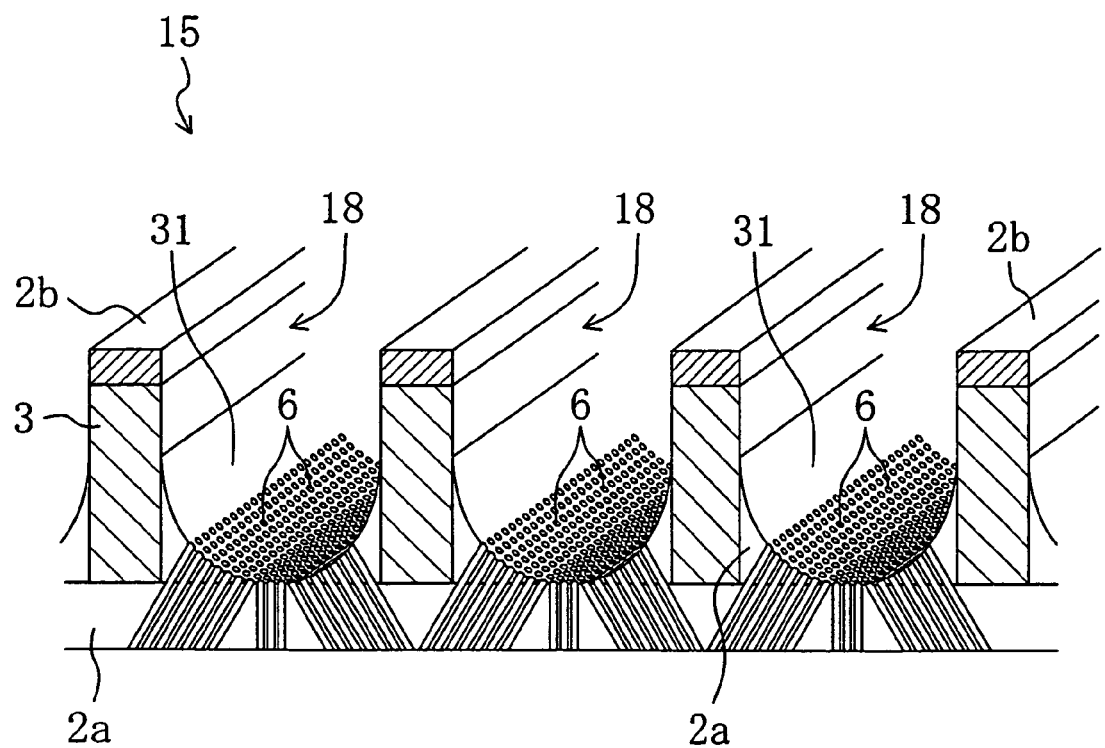
FIG. 31 is a general perspective view of a plasma discharge production section according to embodiment 20.

FIG. 31 is a schematic perspective view showing a portion of a plasma CVD apparatus according to embodiment 20 of the present invention. It should be noted that in FIG. 31, the hatching of the cathode electrode 2a is omitted for clarity of illustration. The plasma CVD apparatus of embodiment 20 is described with reference to FIG. 31.

In embodiment 20, the gas release direction from the gas inlets 6 is different from that of embodiment 17. The gas inlets 6 are designed so as to release the gas in a direction oblique (i.e., not parallel) with respect to the normal line direction of the target substrate 4. As shown in FIG. 31, the left side of the curved surface 31 in each trench 18 has 7 lines of gas inlets 6 through which the gas is released in a right-upward direction. The right side of the curved surface 31 in each trench 18 also has 7 lines of gas inlets 6 through which the gas is released in a left-upward direction. At the bottom of the trench 18, for example, 3 lines of gas inlets 6 are aligned along the longitudinal direction of the trench 18 such that the gas is released in the normal line direction of the target substrate 4. In each of the left side, right side, and central area of the curved surface 31, the gas inlets 6 release the gas in directions parallel to each other.

Thus, in embodiment 20, the gas release direction is oblique with respect to the normal line direction of the substrate 24, and therefore, the distance of the source gas stream passing through the plasma region in the trench 18 increases, whereby dissociation of the source gas is accelerated. As a result, the gas residence time in the plasma region is increased, and dissociation and decomposition of the gas are accelerated. Thus, the film quality is further improved.

(Embodiment 21)

Figure 32:
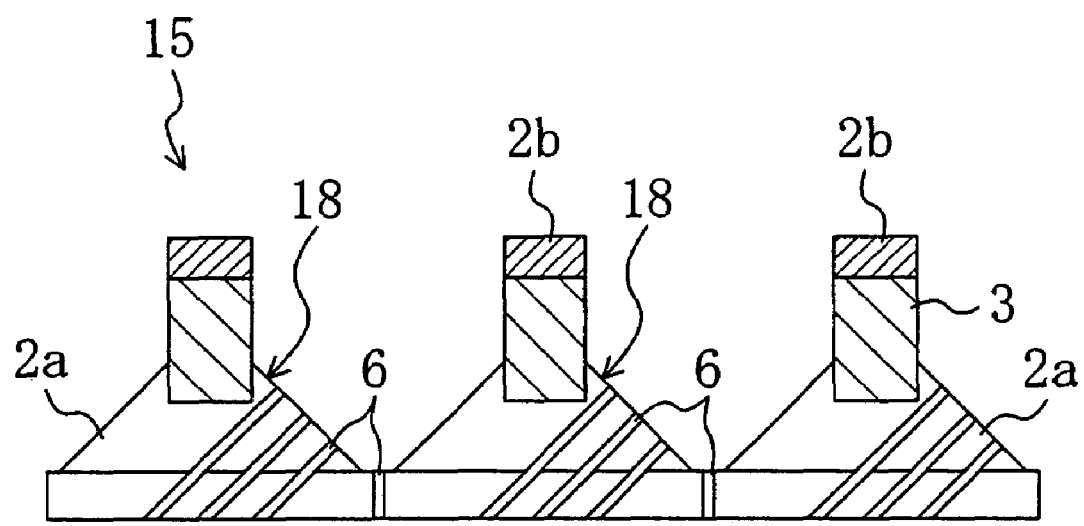
FIG. 32 is an enlarged cross-sectional view of a plasma discharge production section according to embodiment 21.

FIG. 32 is an enlarged cross-sectional view showing a portion of a plasma discharge production section 15 according to embodiment 21 of the present invention.

In embodiment 21, the gas release direction from the gas inlets 6 is different from that of embodiment 16. Specifically, a plurality of gas inlets 6 are provided along the trench width direction and designed so as to release the gas in a direction perpendicular to a sloped surface of the plasma discharge surface of the cathode electrode 2a.

According to embodiment 21, although each trench 18 has two sloped surfaces, the plurality of gas inlets 6 are provided in one of the two sloped surfaces. Furthermore, a plurality of gas inlets 6 are further provided at the bottom of each trench 18 along the longitudinal direction of the trench 18 as in embodiment 1.

In general, the plasma discharge route runs in a direction perpendicular to the plasma discharge surface of the cathode electrode 2a. Since the gas release direction is perpendicular to the plasma discharge surface in embodiment 21, the gas is introduced along the discharge route. Thus, decomposition and dissociation of the gas are efficiently performed.

Since the gas inlets 6 are provided in only one of the two sloped surfaces in each trench 18, occurrence of turbulence in the gas streams is more suppressed as compared with the case where the gas inlets 6 are provided in the both sloped surfaces.

It should be noted that the trench 18 of embodiment 21 has two sloped surfaces but may have any other shape. For example, in one possible structure, the trench 18 has the curved surface 31 as shown in FIG. 10, a plurality of gas inlets 6 are provided along the trench width direction, and the gas release direction of each gas inlet 6 is perpendicular to a tangential plane of the curved surface 31.

As described above, the present invention is useful for a plasma process apparatus including a plasma discharge production section which produces a plasma discharge between a first electrode and a second electrode, an electronic device produced by the plasma process apparatus, and a production method of the electronic device. The present invention is especially suitable to a case where a high quality film is formed at a low process temperature.

What is claimed is:

1. A plasma process apparatus for performing a plasma process on a target substrate, the apparatus comprising:
   a process chamber in which the target substrate is installed;
   a gas inlet for introducing a gas into the process chamber; and
   a plasma discharge production section for producing a plasma discharge in the process chamber,
   wherein the plasma discharge production section includes a first electrode and a second electrode that is closer to the target substrate than the first electrode is,
   wherein the first and second electrodes are on the same side of the target substrate; and
   only surfaces of the first and second electrodes which can be seen in the normal line direction of the target substrate function as a plasma discharge surface.

2. A plasma process apparatus for performing a plasma process on a target substrate, the apparatus comprising:
   a process chamber in which the target substrate is installed;
   a gas inlet for introducing a gas into the process chamber; and
   a plasma discharge production section for producing a plasma discharge in the process chamber,
   wherein the plasma discharge production section includes a first electrode, an insulating layer formed on a portion of an electrode surface of the first electrode, and a second electrode formed on the insulating layer.

3. The plasma process apparatus according to claim 1, wherein the gas inlet is provided at the first electrode.

4. The plasma process apparatus according to claim 1, wherein the first electrode has a concaved plasma discharge surface.

5. The plasma process apparatus according to claim 1, wherein the area of a plasma discharge surface of the first electrode is larger than that of the second electrode.

6. A plasma process apparatus for performing a plasma process on a target substrate, the apparatus comprising:
   a process chamber in which the target substrate is installed;
   a gas inlet for introducing a gas into the process chamber; and
   a plasma discharge production section for producing a plasma discharge in the process chamber,
   wherein the plasma discharge production section includes a first electrode and a second electrode that is closer to the target substrate than the first electrode is;
   only surfaces of the first and second electrodes which can be seen in the normal line direction of the target substrate function as a plasma discharge surface; and
   wherein the plasma discharge production section includes a plurality of plasma discharge surface regions of the first electrode and a plurality of plasma discharge surface regions of the second electrode.

7. A plasma process apparatus for performing a plasma process on a target substrate, the apparatus comprising:
   a process chamber in which the target substrate is installed;
   a gas inlet for introducing a gas into the process chamber; and
   a plasma discharge production section for producing a plasma discharge in the process chamber,
   wherein the plasma discharge production section includes a first electrode and a second electrode that is closer to the target substrate than the first electrode is;
   only surfaces of the first and second electrodes which can be seen in the normal line direction of the target substrate function as a plasma discharge surface; and
   wherein plasma discharge surface regions of the first electrode and plasma discharge surface regions of the second electrode are alternately provided along one planar direction of the target substrate; and
   the distance between the second electrode and the target substrate is greater than the distance between the adjacent second electrodes.

8. The plasma process apparatus according to claim 1, further comprising a power source for applying electric energy to the first and second electrodes,
   wherein the frequency of the power source is equal to or higher than 100 kHz and equal to or lower than 300 MHz.

9. A plasma process apparatus for performing a plasma process on a target substrate, the apparatus comprising:
   a process chamber in which the target substrate is installed;
   a gas inlet for introducing a gas into the process chamber; and
   a plasma discharge production section for producing a plasma discharge in the process chamber, wherein the plasma discharge production section includes a first electrode and a second electrode that is closer to the target substrate than the first electrode is;

only surfaces of the first and second electrodes which can be seen in the normal line direction of the target substrate function as a plasma discharge surface; and wherein a plasma discharge surface of the first electrode has a concavely curved surface.

10. The plasma process apparatus according to claim 9, wherein a plasma discharge surface of the first electrode and a plasma discharge surface of the second electrode constitute portions of a continuously curved surface.

11. The plasma process apparatus according to claim 1, wherein a plasma discharge surface of the first electrode has a plurality of cavities.

12. The plasma process apparatus according to claim 11, wherein a gas inlet is formed in a bottom of at least one of the cavities.

13. A plasma process apparatus for performing a plasma process on a target substrate, the apparatus comprising:

a process chamber in which the target substrate is installed;

a gas inlet for introducing a gas into the process chamber; and a plasma discharge production section for producing a plasma discharge in the process chamber, wherein the plasma discharge production section includes a first electrode and a second electrode that is closer to the target substrate than the first electrode is;

only surfaces of the first and second electrodes which can be seen in the normal line direction of the target substrate function as a plasma discharge surface; and wherein the first electrode is provided with a plurality of concavities opened onto the target substrate.

14. The plasma process apparatus according to claim 13, wherein the shape of the opening of each concavity is rectangular.

15. The plasma process apparatus according to claim 13, wherein the shape of the opening of each concavity is circular.

16. A plasma process apparatus, comprising:

a process chamber in which a target substrate is installed;

a gas inlet for introducing a gas into the process chamber; and a plasma discharge production section provided in the process chamber for performing a plasma process on the target substrate, wherein the plasma discharge production section includes a plurality of insulators arranged in a stripe pattern extending along a direction parallel to the target substrate, first electrodes provided in at least areas between the adjacent insulators, and second electrodes provided at ends of the insulators which are closer to the target substrate such that the second electrodes are separated from the first electrodes.

17. The plasma process apparatus according to claim 16, wherein the first electrodes provided between the adjacent insulators are separated from each other.

18. The plasma process apparatus according to claim 16, wherein:

a plurality of gas inlets are formed in the first electrode; and the plurality of gas inlets are arranged along a direction that is not parallel to the longitudinal direction of the striped insulators.

19. The plasma process apparatus according to claim 17, wherein the plurality of gas inlets are arranged along a direction perpendicular to the longitudinal direction of the striped insulators.

20. The plasma process apparatus according to claim 18, wherein the gas inlets are designed to release a gas in directions parallel to each other.

21. The plasma process apparatus according to claim 18, wherein each gas inlet is designed to release a gas in a direction perpendicular to the plasma discharge surface of the first electrode.

22. The plasma process apparatus according to claim 18, wherein each gas inlet is designed to release a gas in a direction oblique with respect to the normal line direction of the target substrate.

23. A plasma process apparatus for performing a plasma process on a target substrate, the apparatus comprising:

a process chamber in which the target substrate is installed;

a gas inlet for introducing a gas into the process chamber; and a plasma discharge production section, for producing a plasma discharge in the process chamber, wherein the plasma discharge production section includes a first electrode, an insulating layer formed on a portion of an electrode surface of the first electrode that is closer to the target substrate, and a second electrode formed on the insulating layer.

* * * * *